United States Patent
Seshita

(10) Patent No.: US 8,390,339 B2
(45) Date of Patent: Mar. 5, 2013

(54) RADIO-FREQUENCY SEMICONDUCTOR SWITCH

(75) Inventor: Toshiki Seshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/467,267

(22) Filed: May 9, 2012

(65) Prior Publication Data

US 2012/0218010 A1 Aug. 30, 2012

Related U.S. Application Data

(63) Continuation of application No. 12/726,523, filed on Mar. 18, 2010, now abandoned.

(30) Foreign Application Priority Data

Aug. 31, 2009 (JP) ................................ 2009-200193

(51) Int. Cl.
*H03K 3/00* (2006.01)
(52) U.S. Cl. .................. 327/108; 327/434; 333/103
(58) Field of Classification Search .................. 327/108, 327/434; 333/103
See application file for complete search history.

(56) References Cited

U.S. PATENT DOCUMENTS

| 4,078,214 A * | 3/1978 | Beno .............................. 333/103 |
| 6,804,502 B2 | 10/2004 | Burgener et al. |
| 7,106,121 B2 | 9/2006 | Hidaka et al. |
| 2009/0023415 A1 | 1/2009 | Seshita |
| 2009/0181630 A1 | 7/2009 | Seshita et al. |
| 2010/0073066 A1 | 3/2010 | Seshita et al. |

FOREIGN PATENT DOCUMENTS

JP 2005515657 5/2005

OTHER PUBLICATIONS

United States Office Action for U.S. Appl. No. 12/726,523 mailed on Feb. 17, 2012.

* cited by examiner

*Primary Examiner* — Kenneth B. Wells
(74) *Attorney, Agent, or Firm* — Turocy & Watson, LLP

(57) ABSTRACT

A semiconductor switch includes: a switch section, provided on a substrate, switching connection states among a plurality of terminals; a positive voltage generator generating a positive potential higher than a supply potential supplied from a power-supply line; a driver, connected to an output line of the positive voltage generator, supplying a control signal to the switch section in response to a terminal switching signal; and a voltage controller, provided on the same substrate, controlling to connect the output line of the positive voltage generator to the power-supply line for a first period corresponding to a change in the connection states, and controlling to disconnect the output line from the power-supply line after the first period.

3 Claims, 13 Drawing Sheets

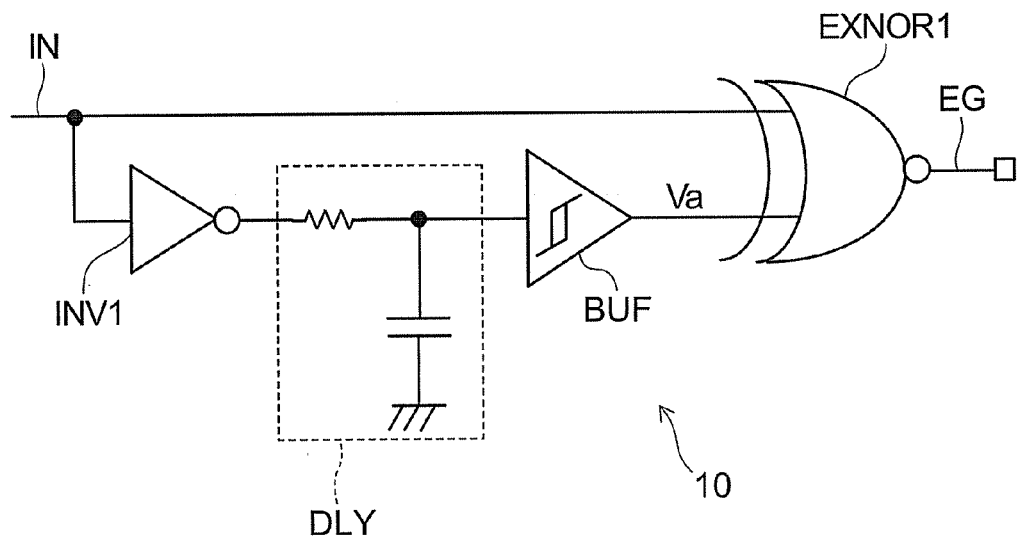
FIG. 3
FIG. 4A
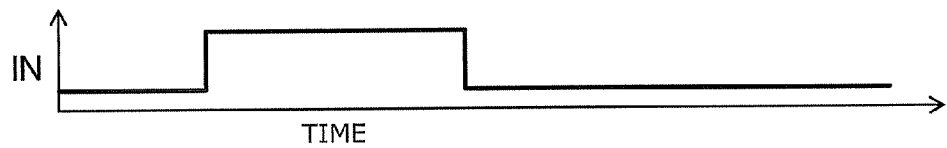
FIG. 4B
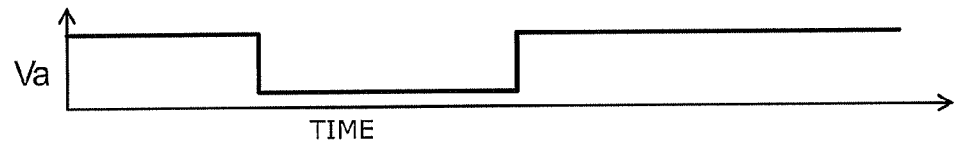
FIG. 4C
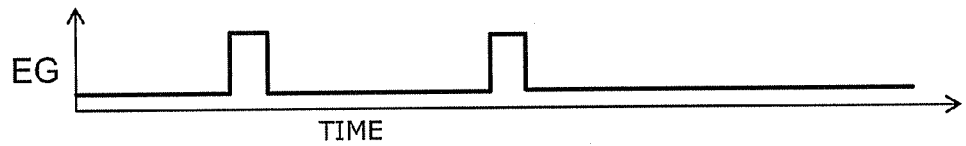

RADIO-FREQUENCY SEMICONDUCTOR SWITCH

CROSS-REFERENCE TO RELATED APPLICATIONS

This application is a Continuation of application Ser. No. 12/726,523 filed Mar. 18, 2010; the entire contents of which are incorporated herein by reference.

This application is based upon and claims the benefit of priority from the prior Japanese Patent Application No. 2009-200193, filed on Aug. 31, 2009; the entire contents of which are incorporated herein by reference.

BACKGROUND

1. Field

Embodiments of the invention relate generally to a semiconductor switch.

2. Background Art

In a radio-frequency circuit section of a cellular phone, a transmitting circuit and a receiving circuit are selectively connected to a common antenna through a switching circuit for radio-frequency signals. A high electron mobility transistor (HEMT) made of a compound semiconductor has been conventionally used as a switching element of the switching circuit for radio-frequency signals. Increasing demands of recent years for lower costs and miniaturization encourage the idea of replacing the HEMT with a metal oxide semiconductor field effect transistor (MOSFET) which is formed on a silicon substrate.

A MOSFET formed on an ordinary silicon substrate, however, has a large parasitic capacitance between the silicon substrate and either the source electrode or the drain electrode. In addition, silicon, which is a semiconductor material, causes a large electric-power loss of radio-frequency signals. One of the techniques to address these problems is to form a switching circuit for radio-frequency signals on a silicon-on-insulator (SOI) substrate (see, for example, JP-A 2005-515657 (Kokai)).

A radio-frequency switch of a MOSFET has to internally generate an appropriate gate potential in order to acquire the radio-frequency characteristics (e.g., the insertion loss, and the on-distortion/off-distortion) required, for example, in a cellular phone.

Such voltage generation circuit, however, requires a large layout area for controlling potential fluctuations at the time of switching at the switching circuit, and for achieving quicker switching responses.

SUMMARY

According to an aspect of the invention, there is provided a switching circuit including: a switch section, provided on a substrate, switching connection states among a plurality of terminals; a positive voltage generator generating a positive potential higher than a supply potential supplied from a power-supply line; a driver, connected to an output line of the positive voltage generator, supplying a control signal to the switch section in response to a terminal switching signal; and a voltage controller, provided on the same substrate, controlling to connect the output line of the positive voltage generator to the power-supply line for a first period corresponding to a change in the connection states, and controlling to disconnect the output line from the power-supply line after the first period.

BRIEF DESCRIPTION OF THE DRAWINGS

FIG. 3 is a circuit diagram illustrating the configuration of the edge detecting circuit;

FIGS. 4A to 4C are timing charts of major signals in the edge detecting circuit;

DETAILED DESCRIPTION

Figure 1:
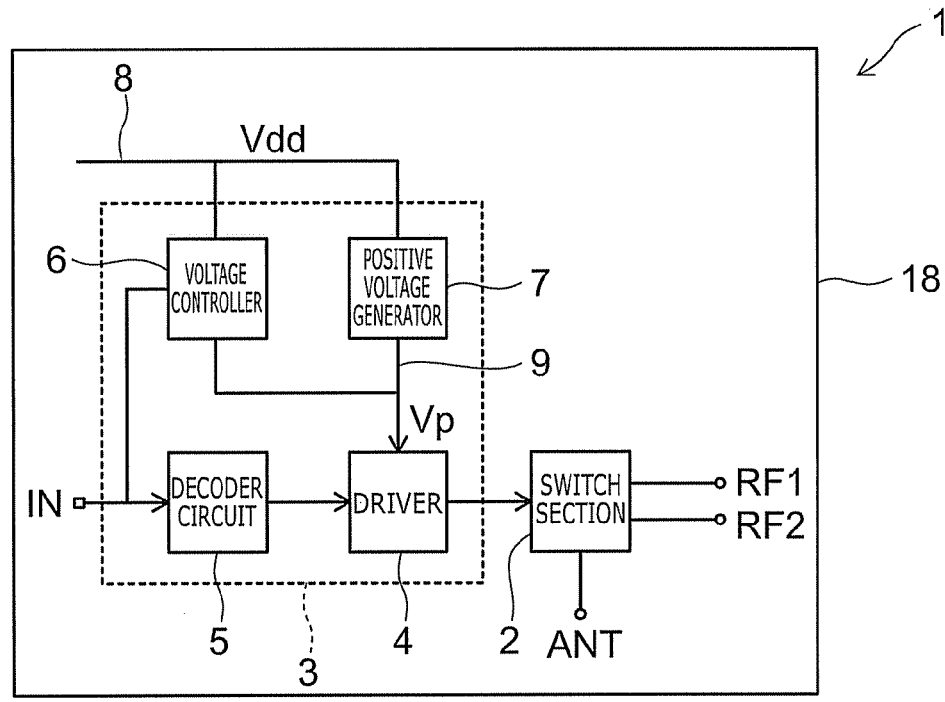
FIG. 1 is a block diagram illustrating the configuration of a semiconductor switch according to an embodiment of the invention.

Embodiments of the invention will now be described in detail with reference to the drawings.

In the specification and the drawings, the same elements as those described previously with reference to earlier figures are labeled with like reference numerals, and the detailed description thereof is omitted as appropriate.

FIG. 1 is a block diagram illustrating the configuration of a semiconductor switch according to an embodiment of the invention.

As shown in FIG. 1, a semiconductor switch 1 of the embodiment includes a switch section 2, a driver 4, a decoder circuit 5, a voltage controller 6, and a positive voltage generator 7. The semiconductor switch 1 has a structure in which all of these components are formed on a single substrate 18, and thereby the semiconductor switch 1 is formed as a single chip. For example, the semiconductor switch 1 is formed on an SOI substrate.

The switch section 2 switches connection between plural terminals. In the example shown in FIG. 1, the switch section 2 switches the connection of an antenna terminal ANT to either one of two radio-frequency terminals RF1 and RF2. As will be described in detail later by referring to FIG. 7, a switching element, such as a MOSFET, may be used as the switch section 2.

The connection states among the plural terminals are switched from one state to another by control signals in response to inputs, from outside, of terminal switching signals IN. The control signals are generated by a controller 3.

The controller 3 includes the driver 4, the decoder circuit 5, the voltage controller 6, the positive voltage generator 7, and the like.

The decoder circuit 5 decodes the inputted terminal switching signal IN and outputs the resultant decoded signal to the driver 4. Then, the driver 4 supplies the control signal to the switch section 2.

The positive voltage generator 7 generates a positive potential Vp that is higher than a supply potential Vdd supplied from outside to a power-supply line 8. The magnitude of the positive potential Vp is set to a value that allows the switch section 2 to have necessary radio-frequency characteristics. The positive potential Vp generated by the positive voltage generator 7 is supplied to the driver 4. The power supply is connected between the power-supply line 8 and the ground. To put it differently, the high-potential-side power supply (the high-potential side of the power supply) is connected to the power-supply line 8 whereas the low-potential-side power supply (the low-potential side of the power supply) is connected to the ground. The positive voltage generator 7 generates a positive voltage with respect to the ground potential. Hence, the positive voltage generated by the positive voltage generator 7 equals to the positive potential Vp.

Figure 5A:
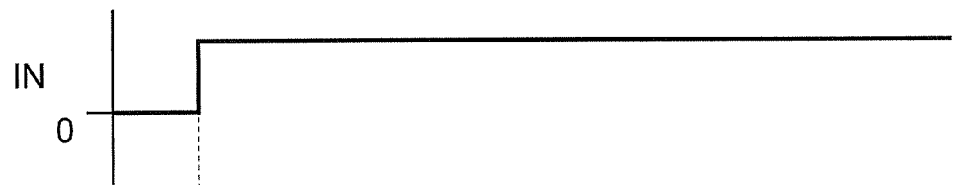
FIGS. 5A to 5C are timing charts of the major signals in the semiconductor switch shown in FIG. 1.
Figure 5B:
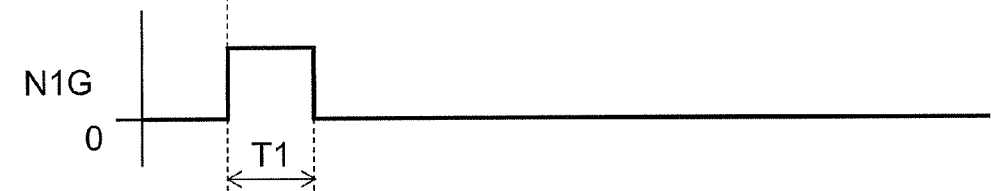
Figure 5C:
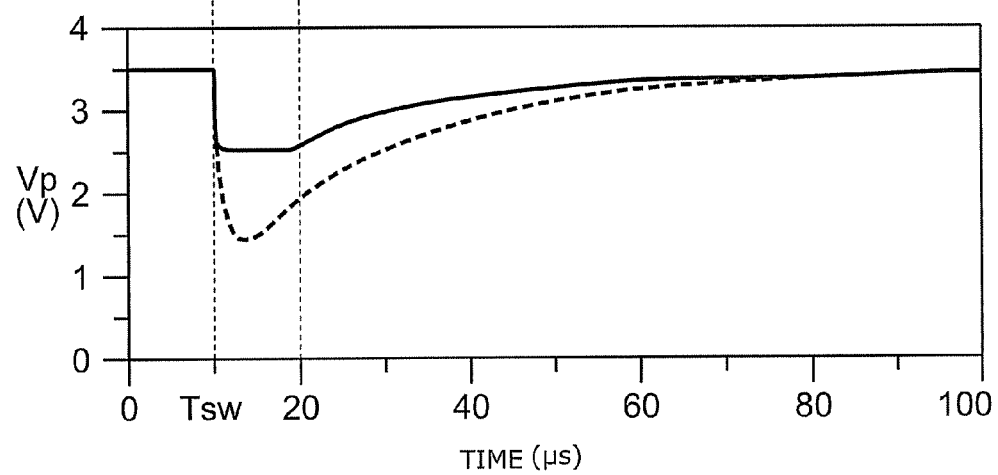

As shown in FIGS. 5A to 5C, the voltage controller 6 is designed to connect an output line 9 of the positive voltage generator 7 to the power-supply line 8 during a first period T1, which corresponds to a change in the connection states by the switch section 2. In addition, the voltage controller 6 is designed to disconnect the output line 9 of the positive voltage generator 7 from the power-supply line 8 after the first period T1 has passed. When the switch section 2 switches the connection states from one state to another, the positive voltage generator 7 outputs a lower potential.

During the first period T1, the voltage controller 6 keeps the connection of the output line 9 of the positive voltage generator 7 to the power-supply line 8, and thereby keeps the positive potential Vp of the output of the positive voltage generator 7 at the supply potential Vdd. After the first period T1 has passed, the voltage controller 6 disconnects the output line 9 of the positive voltage generator 7 from the power-supply line 8, and thus allows the output line 9 to output positive potential Vp.

Here, the first period T1 refers to the period of time from when the switch section 2 switches the connection states from one state to another until when the connection established between the newly-selected two terminals in the switch section 2 satisfies the necessary specifications concerning the insertion loss and the distortions.

Figure 2:
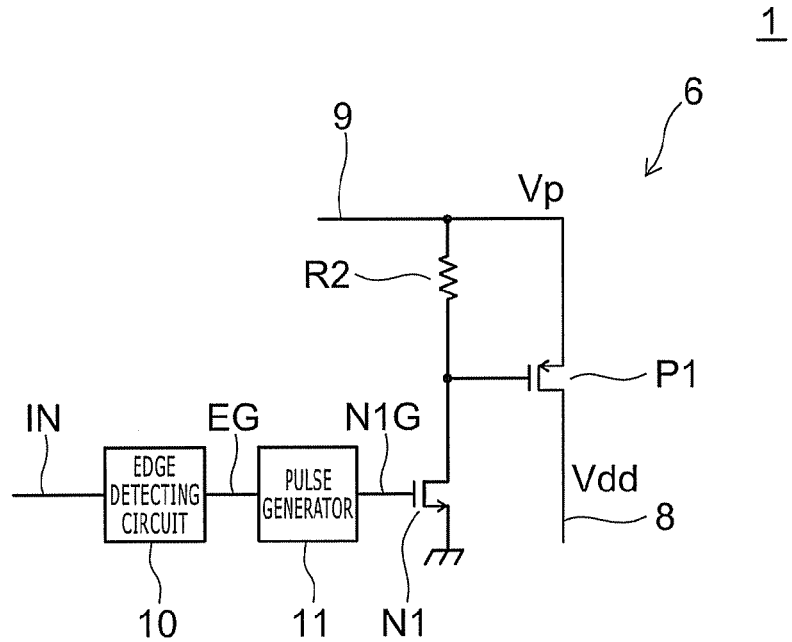
FIG. 2 is a circuit diagram illustrating the configuration of the voltage controller of the semiconductor switch shown in FIG. 1.

FIG. 2 is a circuit diagram illustrating the configuration of the voltage controller of the semiconductor switch shown in FIG. 1.

As shown in FIG. 2, the voltage controller 6 includes an edge detecting circuit 10, a pulse generator 11, an N-channel MOSFET (hereinafter referred to as NMOS) N1, a first transistor P1 of a P-channel MOSFET (hereinafter referred to as PMOS), and a resistor R2.

The edge detecting circuit 10 is designed to detect changes in the terminal switching signal IN, that is, the leading edges and the trailing edges of the terminal switching signal IN. Upon detecting such changes, the edge detecting circuit 10 generates pulses of a certain width.

FIG. 3 is a circuit diagram illustrating the configuration of the edge detecting circuit.

As shown in FIG. 3, the edge detecting circuit 10 detects changes in the terminal switching signal IN by the following series of internal operations. Firstly, the terminal switching signal IN is passed through an inverter circuit INV1. Thereby obtained is the negation of the inputted terminal switching signal IN. Then, the negation of the terminal switching signal IN thus obtained is delayed by an RC delay circuit DLY, and the delayed signal is subjected to a waveform shaping in a buffer BUF. Thereby generated is a signal Va. Then, both the terminal switching signal IN and the signal Va are passed through an exclusive-NOR circuit EXNOR1. The exclusive-NOR circuit EXNOR1 thus obtains the negation of EXOR of the terminal switching signal IN and the signal Va and detects the changes in the terminal switching signal IN. The exclusive-NOR circuit EXNOR1 outputs a signal EG, which is a pulse signal corresponding to the changes in the terminal switching signal IN.

The buffer BUF shown in FIG. 3 is a Schmitt trigger circuit. The signal that has been passed through the RC delay circuit DLY has delayed leading edges and trailing edges. The signal with delayed edges is passed through the buffer BUF to prevent malfunctions otherwise caused by such factors as noises.

FIGS. 4A to 4C are timing charts of major signals in the edge detecting circuit.

FIGS. 4A to 4C shows timing charts of the major signals in the edge detecting circuit 10. Specifically, FIG. 4A is the timing chart of the terminal switching signal IN. FIG. 4B is the timing chart of the delayed signal Va. FIG. 4C is the timing chart of the output signal EG.

As shown in FIG. 4C, pulses of a certain width are generated in the output signal EG at the leading edge and the trailing edge, where the changes occur in the terminal switching signal IN.

Now, refer back to FIG. 2. The pulse generator 11 is designed to receive the output signal EG of the edge detecting circuit 10 and then to generate pulses having a width of the first period T1. For example, the pulse generator 11 may be formed of a timer, and a monostable multivibrator.

If the width of each pulse in the output signal EG is set at the first period T1, the pulse generator 11 may be omitted from the configuration of the voltage controller 6.

The source of the NMOS N1 is grounded whereas the drain of the NMOS N1 is connected to the resistor R2, which is further connected to the output line 9 of the positive voltage generator 7. The NMOS N1 and the resistor R2 together form a resistance-load NMOS inverter. The output of the resistance-load NMOS inverter is connected to the gate of the PMOS P1 (first transistor). The source of the PMOS P1 (first transistor) is connected to the output line 9 of the positive voltage generator 7 whereas the drain of the PMOS P1 is connected to the power-supply line 8.

The output of the pulse generator 11 is inputted to a gate NG1 of the NMOS N1, i.e., to the resistance-load NMOS inverter.

For example, if the output of the pulse generator 11 is of the low level, the output of the resistance-load NMOS inverter is of the high level so as to turn off the PMOS P1 (first transistor). Here, the voltage controller 6 performs no operation at all.

In the other hand, if the output of the pulse generator 11 is of the high level, the output of the resistance-load NMOS inverter is of the low level so as to turn on the PMOS P1 (first transistor). With the PMOS P1 (first transistor) being in the on-state, the voltage controller 6 connects the output line 9 of the positive voltage generator 7 to the power-supply line 8. Accordingly, the positive potential Vp, which is the output of the positive voltage generator 7, is clamped to the supply potential Vdd.

FIGS. 5A to 5C are timing charts of the major signals in the semiconductor switch shown in FIG. 1.

FIGS. 5A to 5C shows timing charts of the major signals in the semiconductor switch 1. Specifically, FIG. 5A is the timing chart of the terminal switching signal IN. FIG. 5B is the timing chart of the signal inputted into the gate N1G of the NMOS N1 of the voltage controller 6. FIG. 5C is the timing chart of the positive potential Vp of the output of the positive voltage generator 7.

As shown in FIG. 5A, the terminal switching signal IN switches from the low level to the high level at a time Tsw. The switching of the terminal switching signal IN makes the edge detecting circuit 10 and the pulse generator 11 input a pulse having a width of the first period T1 to the gate N1G of the NMOS N1 (see FIG. 5B).

The positive potential Vp of the output of the positive voltage generator 7 falls down along with the change in the terminal switching signal IN.

If the voltage controller 6 is not provided, the positive potential Vp would change as represented by the dashed line in FIG. 5C. Specifically, along with the change in the terminal switching signal, the positive potential Vp once would fall down to a level below the supply potential Vdd, and then would gradually rise up to the original potential.

In the semiconductor switch 1, however, the positive potential Vp never becomes below the supply potential Vdd as the solid line in FIG. 5C represents. This is because the voltage controller 6 connects the output line 9 of the positive voltage generator 7 to the power-supply line 8. In addition, once the first period T1 has passed, the positive voltage generator 7 rises from the supply potential Vdd up to the original potential by charging, so that the positive voltage generator 7 can restore its original potential more quickly than in the case without the voltage controller 6.

As has been described thus far, according to the semiconductor switch 1, the switching time can be improved without increasing the layout area.

Note that the semiconductor switch taken as an example in this embodiment is a single-pole double-throw (SPDT) one. Likewise, it is possible to employ a multiport switch, such as an SPnT one and an mPnT one (where m and n are natural numbers that are equal to or larger than 2).

Figure 6:
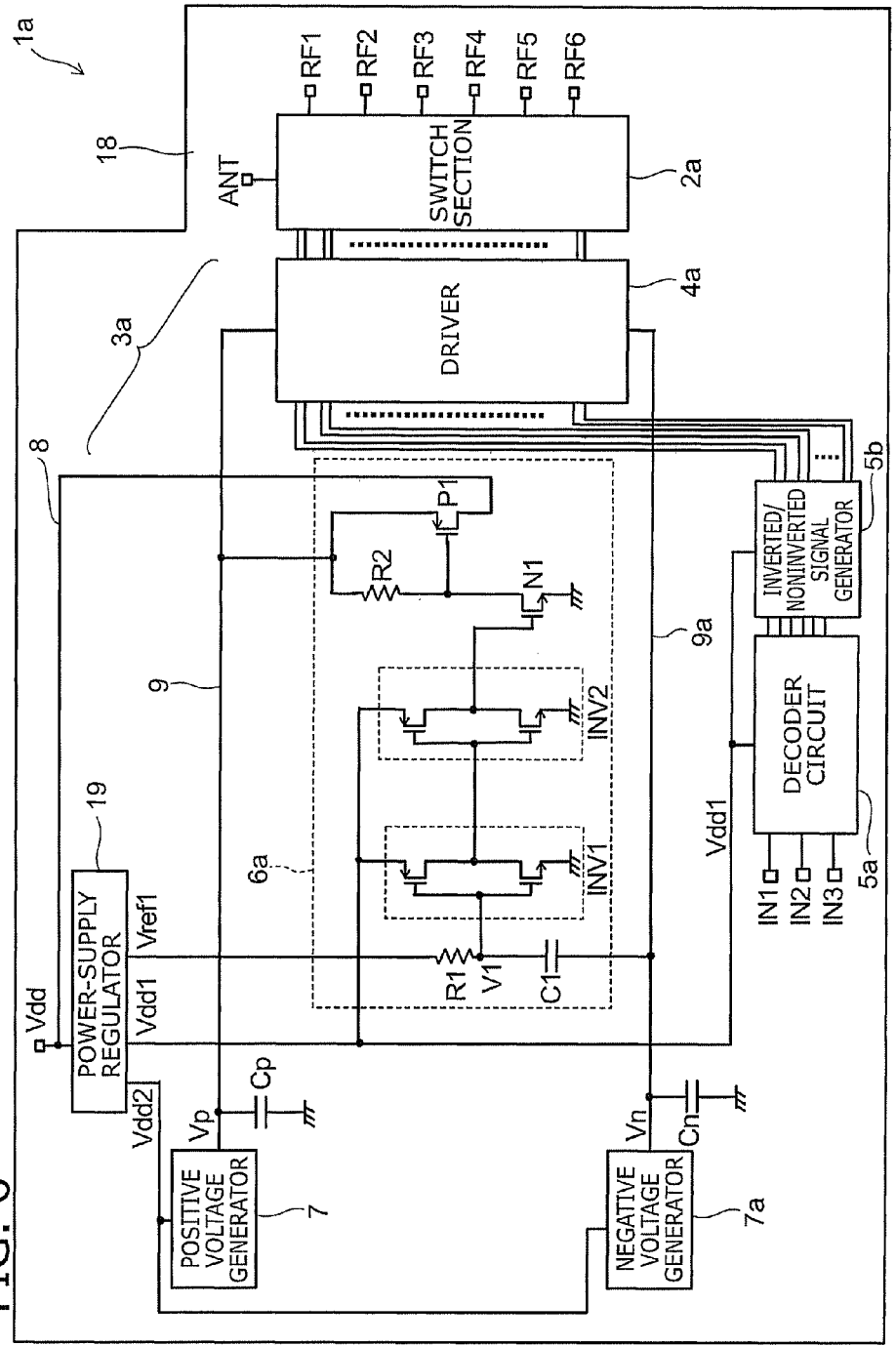
FIG. 6 is a circuit diagram illustrating the configuration of a semiconductor switch according to another embodiment of the invention.

FIG. 6 is a circuit diagram illustrating the configuration of a semiconductor switch according to another embodiment of the invention.

As shown in FIG. 6, a semiconductor switch 1a of this embodiment includes a switch section 2a, a driver 4a, a decoder circuit 5a, an inverted/noninverted signal generator 5b, a voltage controller 6a, a positive voltage generator 7, a negative voltage generator 7a, and a power-supply regulator 19. The semiconductor switch 1a has a structure in which all of these components are formed on a single substrate 18, and thereby the semiconductor switch 1a is formed as a single chip.

Specifically, in comparison to the semiconductor switch 1 shown in FIG. 1, the semiconductor switch is additionally includes the negative voltage generator 7a, the power-supply regulator 19, and the inverted/noninverted signal generator 5b.

In addition, the semiconductor switch 1a substitutes the switch section 2a, the driver 4a, the decoder circuit 5a, and the voltage controller 6a respectively for the switch section 2, the driver 4, the decoder circuit 5, and the voltage controller 6 of the semiconductor switch 1 shown in FIG. 1.

The power-supply regulator 19 is designed to generate, from the supply potential Vdd, voltages Vdd1, Vdd2, and Vref1 with respect to the ground.

The supply potential Vdd supplied from outside is, for example, within a range from 2.4 V to 3.2 V. The potential Vdd1 is, for example, 1.8 V. The output with the potential Vdd1 is supplied as the power source to the decoder circuit 5a and the inverted/noninverted signal generator 5b.

The potential Vdd2 is, for example, 2.4 V. The output with the potential Vdd2 is supplied as the power source to the positive voltage generator 7 and the negative voltage generator 7a. Detailed description of the potential Vref1 will be given later.

A positive potential Vp is supplied from the positive voltage generator 7 to the driver 4a whereas a negative potential Vn is supplied from the negative voltage generator 7a to the driver 4a.

An output line 9 of the positive voltage generator 7 is provided with an output capacitor Cp whereas the output line 9a of the negative voltage generator 7a is provided with an output capacitor Cn.

The positive voltage generator 7 is designed to generate a positive voltage with respect to the ground, and the positive voltage of the output of the positive voltage generator 7 is equal to a positive potential Vp. The negative voltage generator 7a is designed to generate a negative voltage with respect to the ground, and the negative voltage of the output of the negative voltage generator 7a is equal to the negative potential Vn of the output line 9a of the negative voltage generator 7a.

Multiport switch section such as single-pole 6-throw (SP6T) switch section is used for a multimode/multiband radio apparatus.

The semiconductor switch is such a multiport semiconductor switch that can be used for multimode/multiband radio apparatuses or the like.

The switch section 2a is designed to switch the connection states among plural terminals from one state to another. The switch section 2a of the example shown in FIG. 6 is an SP6T switch section, and is designed to switch the connection states of an antenna terminal ANT to either one of six radio-frequency terminals RF1 to RF6.

Figure 7:
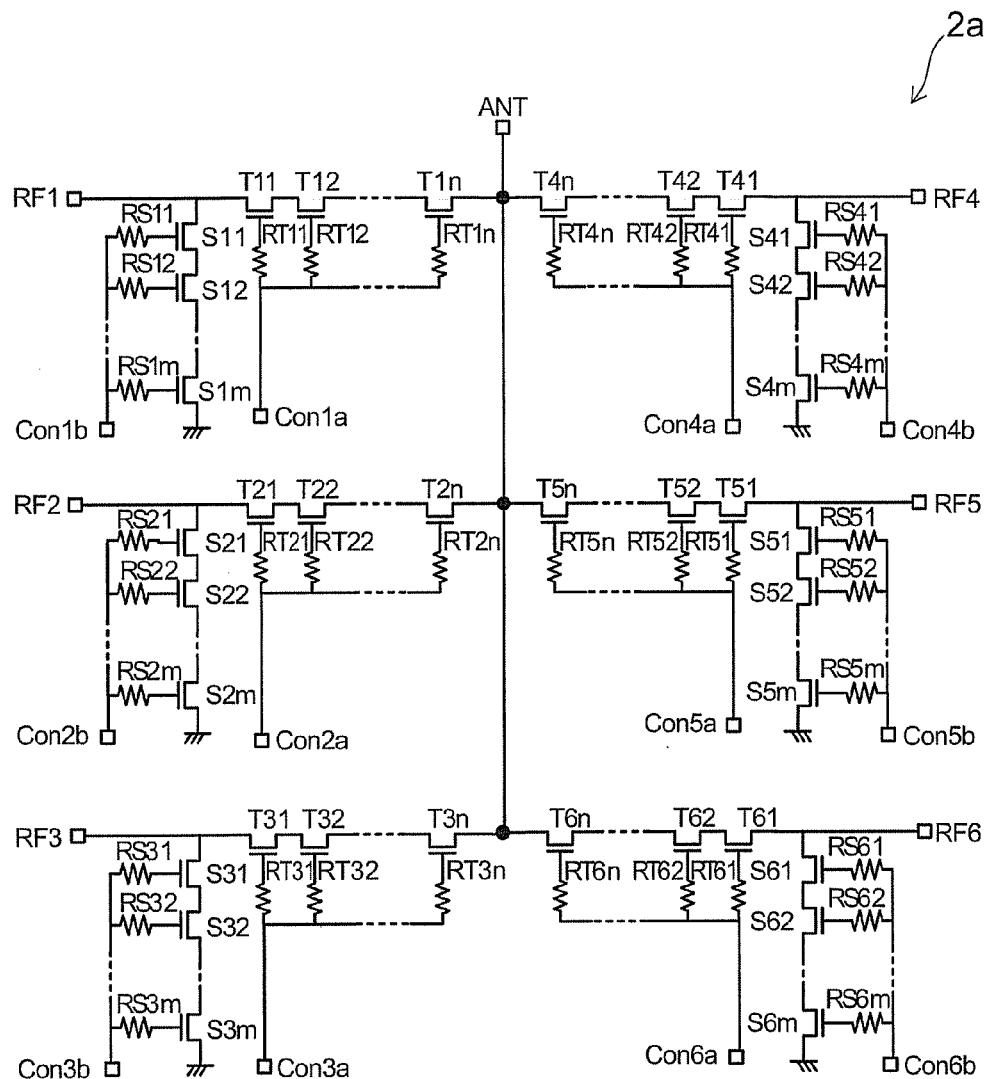
FIG. 7 is a circuit diagram illustrating the configuration of the switch section of the semiconductor switch shown in FIG. 6.

FIG. 7 is a circuit diagram illustrating the configuration of the switch section of the semiconductor switch shown in FIG. 6.

As shown in FIG. 7, between the antenna terminal ANT and each of the radio-frequency terminals RF1 to RF6, n stages (n is a natural number) of through-FETs (field effect transistors) T11, T12, . . . , and T1n; T21, T22, . . . , and T2n; . . . ; or T61, T62, . . . , and T6n are connected in series.

Specifically, between the antenna terminal ANT and the radio-frequency terminal RF1, the through-FETs T11, T12, . . . , and T1n are connected. Between the antenna terminal ANT and the radio-frequency terminal RF2, the through-FETs T21, T22, . . . , and T2n are connected. Between the antenna terminal ANT and the radio-frequency terminal RF3, the through-FETs T31, T32, . . . , and T3n are connected. Between the antenna terminal ANT and the radio-frequency terminal RF4, the through-FETs T41, T42, . . . , and T4n are connected. Between the antenna terminal ANT and the radio-frequency terminal RF5, the through-FETs T51, T52, . . . , and T5n are connected. Between the antenna terminal ANT and the radio-frequency terminal RF6, the through-FETs 161, T62, . . . , and T6n are connected.

Between the ground and each of the radio-frequency terminals RF1 to RF6, m stages (m is a natural number) of shunt-FETs S11, S12, . . . , and S1m; S21, S22, . . . , and S2m; . . . ; or S61, S62, . . . , and S6m are connected in series. Specifically, between the radio-frequency terminal RF1 and the ground, shunt-FETs S11, S12, . . . , and S1m are connected. Between the radio-frequency terminal RF2 and the ground, shunt-FETs S21, S22, . . . , and S2m are connected. Between the radio-frequency terminal RF3 and the ground, shunt-FETs S31, S32, . . . , and S3m are connected. Between the radio-frequency terminal RF4 and the ground, shunt-FETs S41, S42, . . . , and S4m are connected. Between the radio-frequency terminal RF5 and the ground, shunt-FETs S51, S52, . . . and S5m are connected. Between the radio-frequency terminal RF6 and the ground, shunt-FETs S61, S62, . . . , and S6m are connected.

The gates of the through-FETs T11, T12, . . . , and T1n connected to the radio-frequency terminal RF1 are connected respectively to radio-frequency leakage prevention resistors RT11, RT12, . . . , and RT1n, all of which are further connected to a control terminal Con1a. The control terminal Con1a is connected to the driver 4a. Each of the resistors RT11, RT12, . . . , and RT1n has a resistance that is high enough to prevent the radio-frequency signals from leaking out to the driver 4a.

The gates of the shunt-FETs S11, S12, . . . , and S1m connected to the radio-frequency terminal RF1 are connected respectively to radio-frequency leakage prevention resistors RS11, RS12, . . . , and RS1m, all of which are further connected to a control terminal Con1b. The control terminal Con1b is connected to the driver 4a. Each of the resistors RS11, RS12, . . . , and RS1m has a resistance that is high enough to prevent the radio-frequency signals from leaking out to the driver 4a.

The gates of the through-FETs T21, T22, . . . , and T2n connected to the radio-frequency terminal RF2 are connected respectively to radio-frequency leakage prevention resistors RT21, RT22, . . . , and RT2n, all of which are further connected to a control terminal Con2a. The control terminal Con2a is connected to the driver 4a. Each of the resistors RT21, RT22, . . . , and RT2n has a resistance that is high enough to prevent the radio-frequency signals from leaking out to the driver 4a.

The gates of the shunt-FETs S21, S22, . . . , and S2m connected to the radio-frequency terminal RF2 are connected respectively to radio-frequency leakage prevention resistors RS21, RS22, . . . , and RS2m, all of which are further connected to a control terminal Con2b. The control terminal Con2b is connected to the driver 4a. Each of the resistors RS21, RS22, . . . , and RS2m has a resistance that is high enough to prevent the radio-frequency signals from leaking out to the driver 4a.

The gates of the through-FETs T31, T32, . . . , and T3n connected to the radio-frequency terminal RF3 are connected respectively to radio-frequency leakage prevention resistors RT31, RT32, . . . , and RT3n, all of which are further connected to a control terminal Con3a. The control terminal Con3a is connected to the driver 4a. Each of the resistors RT31, RT32, . . . , and RT3n has a resistance that is high enough to prevent the radio-frequency signals from leaking out to the driver 4a.

The gates of the shunt-FETs S31, S32, . . . , and S3m connected to the radio-frequency terminal RF3 are connected respectively to radio-frequency leakage prevention resistors RS31, RS32, . . . , and RS3m, all of which are further connected to a control terminal Con3b. The control terminal Con3b is connected to the driver 4a. Each of the resistors RS31, RS32, . . . , and RS3m has a resistance that is high enough to prevent the radio-frequency signals from leaking out to the driver 4a. The gates of the through-FETs T41, T42, . . . , and T4n connected to the radio-frequency terminal RF4 are connected respectively to radio-frequency leakage prevention resistors RT41, RT42, . . . , and RT4n, all of which are further connected to a control terminal Con4a. The control terminal Con4a is connected to the driver 4a. Each of the resistors RT41, RT42, . . . , and RT4n has a resistance that is high enough to prevent the radio-frequency signals from leaking out to the driver 4a.

The gates of the shunt-FETs S41, S42, . . . , and S4m connected to the radio-frequency terminal RF4 are connected respectively to radio-frequency leakage prevention resistors RS41, RS42, . . . , and RS4m, all of which are further connected to a control terminal Con4b. The control terminal Con4b is connected to the driver 4a. Each of the resistors RS41, RS42, . . . , and RS4m has a resistance that is high enough to prevent the radio-frequency signals from leaking out to the driver 4a. The gates of the through-FETs T51, T52, . . . , and T5n connected to the radio-frequency terminal RF5 are connected respectively to radio-frequency leakage prevention resistors RT51, RT52, and RT5n, all of which are further connected to a control terminal Con5a. The control terminal Con5a is connected to the driver 4a. Each of the resistors RT51, RT52, . . . , and RT5n has a resistance that is high enough to prevent the radio-frequency signals from leaking out to the driver 4a.

The gates of the shunt-FETs S51, S52, . . . , and S5m connected to the radio-frequency terminal RF5 are connected respectively to radio-frequency leakage prevention resistors RS51, RS52, and RS5m, all of which are further connected to a control terminal Con5b. The control terminal Con5b is connected to the driver 4a. Each of the resistors RS51, RS52, . . . , and RS5m has a resistance that is high enough to prevent the radio-frequency signals from leaking out to the driver 4a.

The gates of the through-FETs T61, T62, . . . , and T6n connected to the radio-frequency terminal RF6 are connected respectively to radio-frequency leakage prevention resistors RT61, RT62, . . . , and RT6n, all of which are further connected to a control terminal Con6a. The control terminal Con6a is connected to the driver 4a. Each of the resistors RT61, RT62, . . . , and RT6n has a resistance that is high enough to prevent the radio-frequency signals from leaking out to the driver 4a.

The gates of the shunt-FETs S61, S62, . . . , and S6m connected to the radio-frequency terminal RF6 are connected respectively to radio-frequency leakage prevention resistors RS61, RS62, . . . , and RS6m, all of which are further connected to a control terminal Con6b. The control terminal Con6b is connected to the driver 4a. Each of the resistors RS61, RS62, . . . , and RS6m has a resistance that is high enough to prevent the radio-frequency signals from leaking out to the driver 4a.

During turn-off of the through FET connected to the radio-frequency terminal to which the shunt FET is connected, the shunt FET enhances isolation between that the radio-frequency terminal and the antenna terminal ANT. More specifically, even when the through-FET is in the off-state, radio-frequency signals sometimes leak out to the radio-frequency terminal connected to the off-state through-FET. Even if such leakage occurs, the leaked radio-frequency signals can be let out to the ground through the on-state shunt-FET. For example, to allow the conduction between the radio-frequency terminal RF1 and the antenna terminal ANT, the n-stage series-connected through-FETs T11 to T1n located between the radio-frequency terminal RF1 and the antenna terminal ANT have to be turned on, and the m-stage series-connected shunt-FETs S11 to S1m located between the ground and the radio-frequency terminal RF1 have to be turned off. In addition, all the through-FETs connected between the antenna terminal ANT and each of the other radio-frequency terminals RF2 to RF6 have to be turned off, and all the other shunt-FETs connected between the ground and each of the other radio-frequency terminals RF2 to RF6 have to be turned on.

Accordingly, in the above-described case, the control terminal Con1a receives an on potential Von, each of the control terminals Con2b to Con6b receives an on potential Von, the control terminal Con1b receives an off potential Voff, and each of the control terminals Con2a to Con6a receives an off potential Voff. The on potential Von mentioned above refers to a gate potential that makes each of the corresponding FETs in the conduction state and makes the on-resistance sufficiently small. In contrast, the off potential Voff mentioned above refers to a gate potential that makes each of the corresponding FETs in the cutoff state and appropriately keeps the cutoff state even with superposition of the radio-frequency signals. Each FET has a threshold voltage Vth of 0.1 V, for example.

If the on potential Von is lower than a desired potential (e.g., 3 V), the on-resistance of each FET that is in the conduction state becomes higher. The higher on-resistance increases the insertion loss and the distortion generated in the FET in the conduction state (i.e., the on-distortion). In addition, if the off potential Voff is higher than a desired potential (e.g., −1 V), the maximum allowable input power becomes lower, and the distortion generated by the rated input in the FET in the cutoff state (i.e., the off-distortion) is increased.

Note that too high an on potential Von or too low an off potential Voff may exceed the breakdown voltage of the FET. So, the on potential Von and the off potential Voff needs to fall within their respective appropriate ranges.

The control signals to control the gate potentials of the FETs of the switch section 2a are generated by a controller 3a shown in FIG. 6.

The controller 3a includes the decoder circuit 5a to decode inputted terminal switching signals IN1 to IN3, the driver 4a to drive the switch section 2a, an internal-voltage generator, and the like. The internal-voltage generator includes the power-supply regulator 19, the positive voltage generator 7, the negative voltage generator 7a, and the like. Each of the positive voltage generator 7 and the negative voltage generator 7a includes an oscillator, a charge-pump circuit, and the like.

Figure 8:
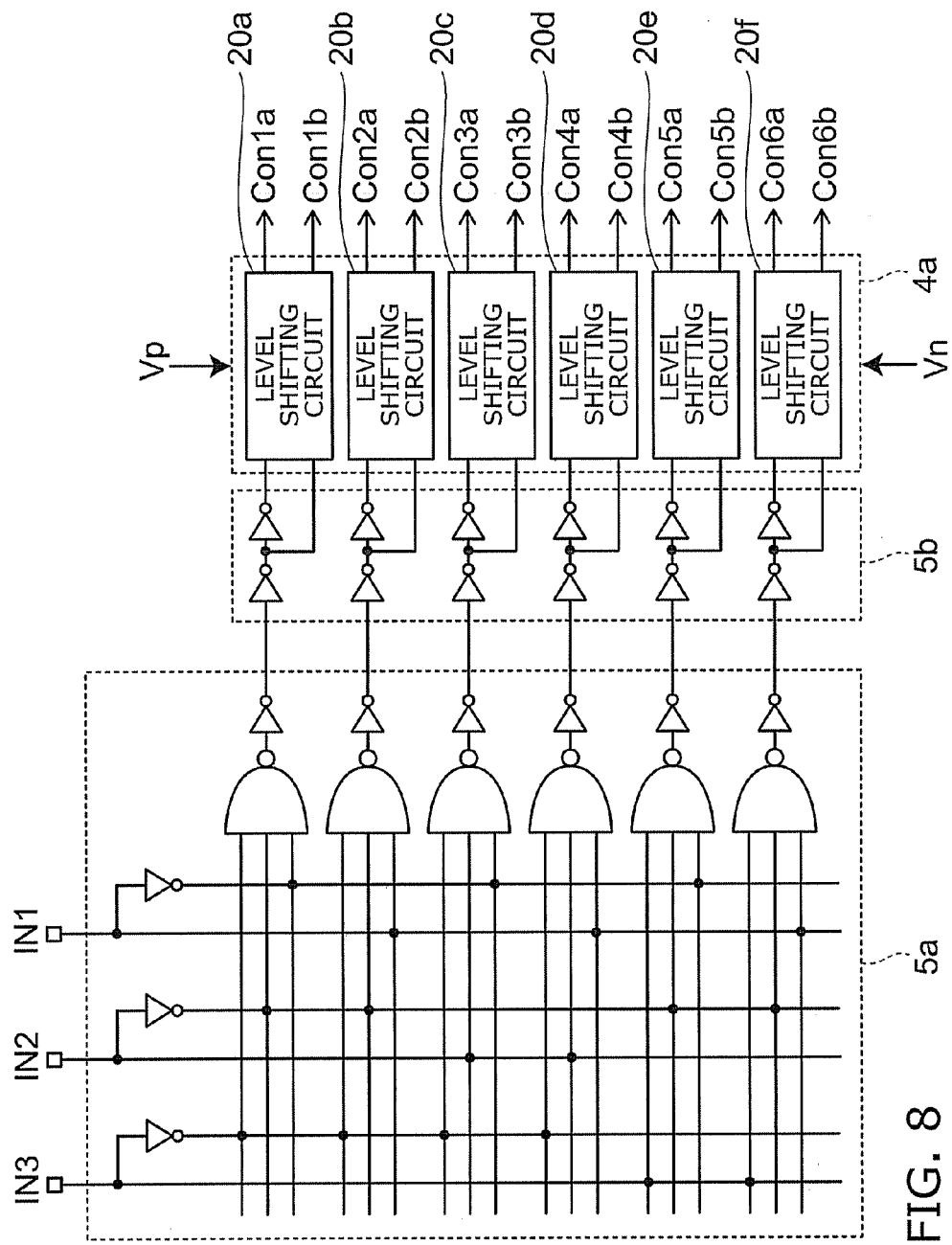
FIG. 8 is a circuit diagram illustrating the configurations of the decoder circuit and the driver of the semiconductor switch shown in FIG. 6.

FIG. 8 is a circuit diagram illustrating the configurations of the decoder circuit and the driver of the semiconductor switch shown in FIG. 6.

As shown in FIG. 8, the terminal switching signals IN1 to IN3 are decoded by the decoder circuit 5a, and the decoded signals are passed through the inverted/noninverted signal generator 5b so as to control the driver 4a. Note that the semiconductor switch 1a of the embodiment has the switch section 2a of SP6T. So, the decoder circuit 5a decodes 3-bit terminal switching signals IN1 to IN3.

The driver 4a includes six level shifting circuits 20a to 20f disposed side by side with each other, to each of which the positive potential Vp is supplied as the high-potential power supply as well as the negative potential Vn is supplied as the low-potential power supply. Note that the positive potential Vp is higher than the potential Vdd1 that is supplied to the other circuits. The control signals outputted from the driver 4a are inputted to the switch section 2a through the control terminals Con1a to Con6a, and Con1b to Con6b.

Note that the level shifting circuits 20a to 20f are differential circuits. Accordingly, the inverted/noninverted signal generator 5b is provided between the decoder circuit 5a and the driver 4a.

Figure 9:
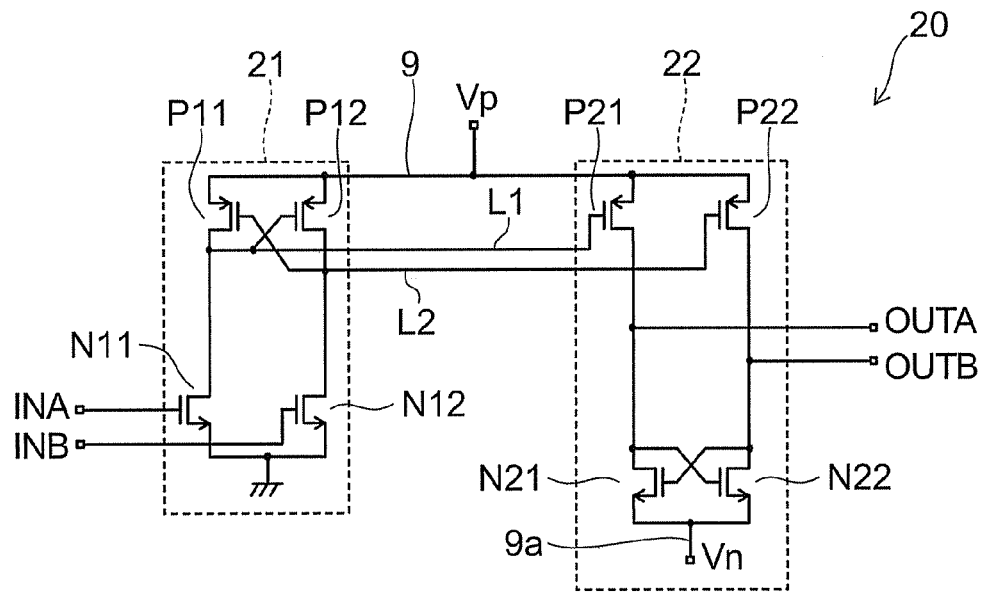
FIG. 9 is a circuit diagram illustrating the configuration of the driver of the semiconductor switch shown in FIG. 6.

FIG. 9 is a circuit diagram illustrating the configuration of the driver of the semiconductor switch shown in FIG. 6.

FIG. 9 shows a circuit diagram of a level shifting circuit 20 included in the driver 4a.

Each of the level shifting circuits 20a to 20f included in the driver 4a has the same configuration as that of the level shifting circuit 20 shown in FIG. 9.

The level shifting circuit 20 includes a first-stage level shifting circuit 21 and a second-stage level shifting circuit 22. The first-stage level shifting circuit 21 includes a pair of NMOSs N11 and N12, and a pair of PMOSs P11 and P12. The second-stage level shifting circuit 22 includes a pair of PMOSs P21 and P22, and a pair of NMOSs N21 and N22.

The sources of the NMOS N11 and N12 are connected to the ground. The gates of the NMOSs N11 and N12 are connected to the unillustrated decoder circuit of the preceding stage, which is not shown in FIG. 9, through input terminals INA and INB, respectively.

The drains of the NMOSs N11 and N12 are connected respectively to the drains of the PMOSs P11 and P12. The source of each of the PMOSs P11 and P12 is connected, through a high-potential power-supply terminal, to the output line 9 of the positive voltage generator 7 (not illustrated in FIG. 9) to which the positive potential Vp is supplied. The gate of the PMOS P11 is connected to the drain of the PMOS P12. Both the gate of the PMOS P11 and the drain of the PMOS P12 are connected to an output line L2, which is one of the two differential output lines of the first-stage level shifting circuit 21. The gate of the PMOS P12 is connected to the drain of the drain of the PMOS P11. Both the gate of the PMOS P12 and the drain of the drain of the PMOS P11 are connected to an output line L1, which is the other one of the two differential output lines of the first-stage level shifting circuit 21.

The output lines L1 and L2 are connected respectively to the gates of the PMOSs P21 and P22 of the second-stage level shifting circuit 22. Through the output lines L1 and L2, the output of the first-stage level shifting circuit 21 is inputted into the second-stage level shifting circuit 22. The source of each of the PMOSs P21 and P22 is connected, through a high-potential power-supply terminal, to the output line 9 of the positive voltage generator 7 (not illustrated in FIG. 9) to which the positive potential Vp is supplied.

The drain of the PMOS P21 is connected to the drain of the NMOS N21. These connection nodes are connected to an output terminal OUTA. The drain of the PMOS P22 is connected to the drain of the NMOS N22. These connection nodes are connected to an output terminal OUTB. Through the output terminals OUTA and OUTB, the above-described on potential Von and the above-described off potential Voff are supplied to the gates of the through-FETs and of the shunt-FETs of the switch section 2a shown in FIG. 7.

Each of the differential inputs INA and INB of the first-stage level shifting circuit 21 has, for example, a 1.8 V high-level input level and a 0 V low-level input level. The decoder circuit 5a and the inverted/noninverted signal generator 5b, both of which are in the preceding stages and neither of which is illustrated in FIG. 9, supplies the input. The positive potential Vp of, for example, 3.5 V is supplied as the high-potential power supply, from the output line 9.

For example, with a high-level (1.8 V) input to INA and a low-level (0 V) input to INB, the potential of the output line L1 becomes equal to the low level (0 V) while the potential of the output line L2 becomes equal to the positive potential Vp, that is, 3.5 V. Accordingly, the output amplitude of the first-stage level shifting circuit 21 becomes approximately 3.5 V, that is, from 0 V to Vp.

The second-stage level shifting circuit 22 receives, as its inputs, the output signals of the first-stage level shifting circuit 21. As in the case of the first-stage level shifting circuit 21, the positive potential Vp, e.g., 3.5 V, is supplied to the second-stage level shifting circuit 22 from the output line 9 as the high-potential power supply. In addition, the negative potential Vn, e.g., −1.5 V, is supplied to the second-stage level shifting circuit 22 from the output line 9*a* as the low-potential power supply.

If, for example, the output line L1 is at the low level (OV) and the output line L2 is at the high level (3.5 V), the potential of the output terminal OUTA becomes equal to the positive potential Vp, that is, 3.5 V, and the potential of the output terminal OUTB becomes equal to the negative potential Vn, that is, −1.5 V. Accordingly, an on potential Von of 3.5 V and an off potential Voff of −1.5 V can be supplied to the gates of the through-FETs and of the shunt-FETs of the switch section 2*a* shown in FIG. 7, and thereby the switch section 2*a* can be driven.

Accordingly, the first-stage level shifting circuit 21 converts the differential input signals having voltages of Vdd1 as a high-level input and of 0 V as a low-level input to differential signals having voltages of a positive potential Vp as a high-level output and of 0 V as a low-level output. The second-stage level shifting circuit 22 converts the voltages of its input signals to a positive potential Vp as a high-level output and a negative potential Vn as a low-level output.

Accordingly, the level shifting circuit 20 converts differential input signals having voltages of Vdd1 as a high-level input and of 0 V as a low-level input to differential output signals having voltages of a positive potential Vp as a high-level output and of Vn as a low-level output.

Figure 10:
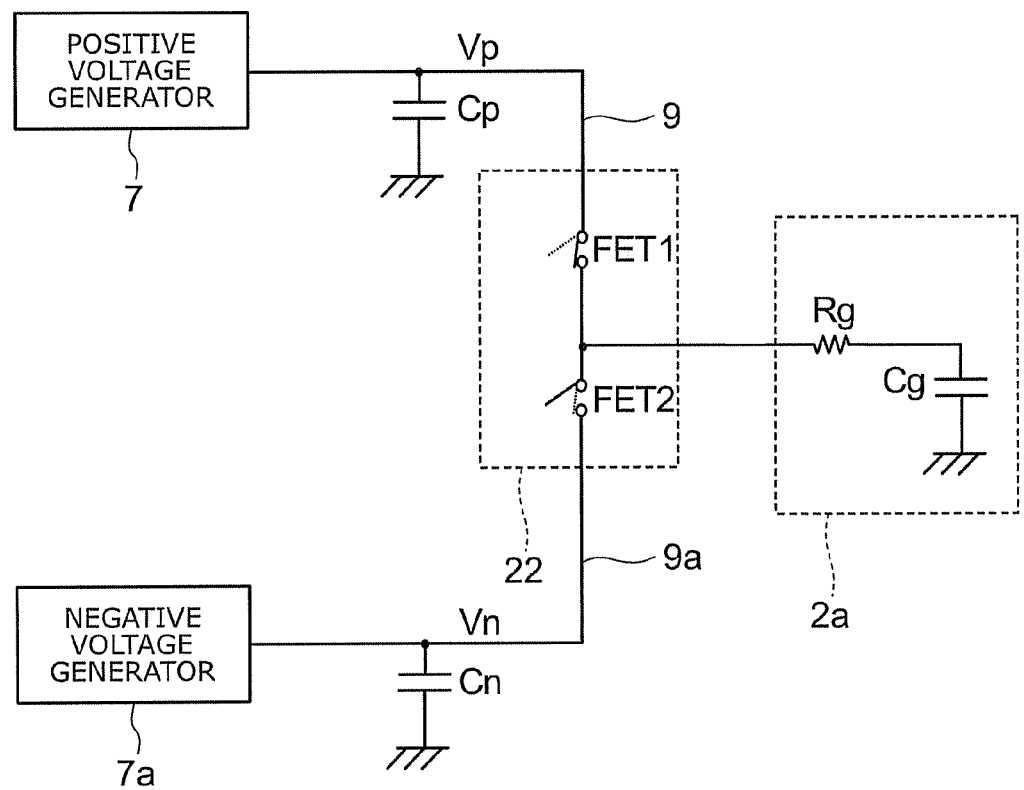
FIG. 10 is a schematic diagram for explaining the operation of the level shifting circuit shown in FIG. 9.

FIG. 10 is a schematic diagram for explaining the operation of the level shifting circuit 20 shown in FIG. 9. FIG. 10 schematically illustrates the positive voltage generator 7, the negative voltage generator 7*a*, the second-stage level shifting circuit 22 shown in FIG. 9, and the switch section 2*a*.

The high-potential power supply of the second-stage level shifting circuit 22 is supplied from the output line 9 of the positive voltage generator 7 whereas the low-potential power supply of the second-stage level shifting circuit 22 is supplied from the output line 9*a* of the negative voltage generator 7*a*. The load on the second-stage level shifting circuit 22 is the gate of the FETs included in the switch section 2*a*, and is modeled by a resistor Rg and the gate capacitor Cg connected to the gate.

For example, if the semiconductor switch 1*a* is used as an antenna switch, the antenna switch has to allow signals of large electric power to pass therethrough with small losses when transmitting the signals. So, the total gate width of the FETs of the switch section 2*a* becomes larger, and the number of the stages for the connected FETs also becomes larger. Consequently, the total capacitance of the gate capacitor Cg to be driven becomes as large as several tens of picofarads or even larger.

If charge pumps are used as the positive voltage generator 7 and the negative voltage generator 7*a*, each charge pump has a limited capacity of supplying current. For example, each charge pump can supply a current of approximately several microamperes at most, and is not capable of charging and discharging rapidly a capacitance of several tens of picofarads. So, to supply transitional current, output capacitors Cp and Cn are provided respectively at the outputs of the positive voltage generator 7 and of the negative voltage generator 7*a*.

Each capacitance of the output capacitors Cp and Cn has to be several hundreds of picofarads or larger. In particular, in a multiport switch, the capacitance of the output capacitor Cp needs to be larger than that of the output capacitor Cn. This is because a multiport switch has more off-state FETs and the gate capacitances of these off-state FETs contribute to the output capacitance of the charge pump of the negative voltage generator 7*a*.

The following description will focus on the operation of a case where the semiconductor switch 1*a* has no voltage controller 6*a*.

Figure 11:
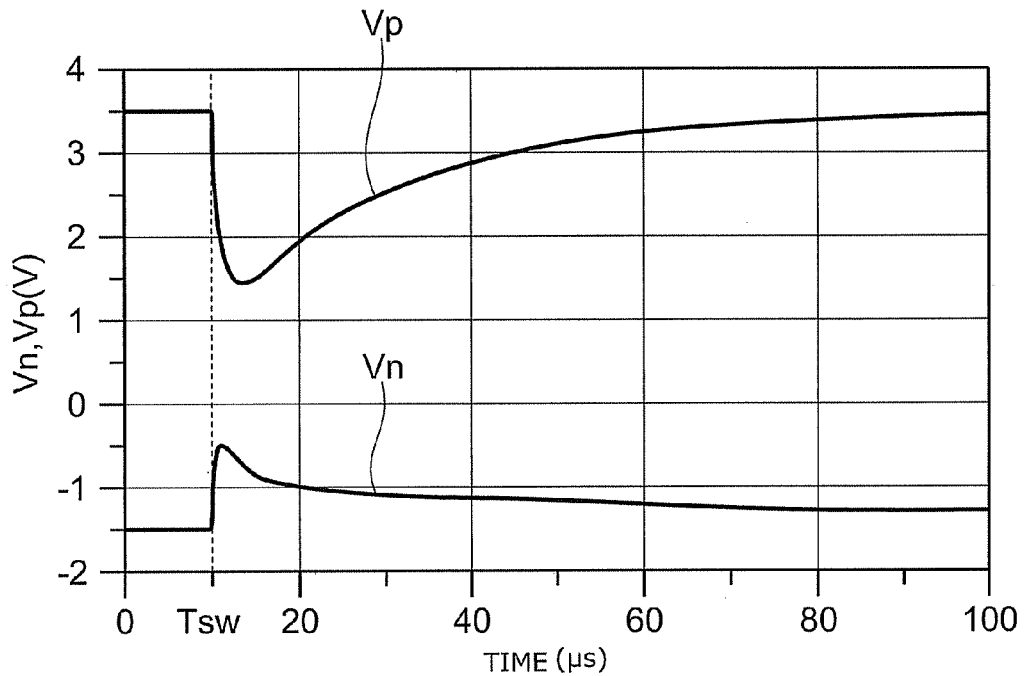
FIG. 11 is a timing chart of major signals in a semiconductor switch of a comparative example with no voltage controller provided.

FIG. 11 is a timing chart of major signals in a semiconductor switch of a comparative example with no voltage controller provided.

FIG. 11 shows the voltage waveform of the positive potential Vp of the output of the positive voltage generator 7 and the voltage waveform of the negative potential Vn of the output of the negative voltage generator 7*a* when the switch section 2*a* switches the connection states from one state to another at the time Tsw=10 μs.

As FIG. 10 shows, the charging and discharging of the total capacitance of the gate capacitor Cg is performed at the moment when the switch section 2*a* switches the connection states from one state to another. Instantaneously, the positive potential Vp falls down and simultaneously the negative potential Vn rises up. Accordingly, the absolute values of the positive potential Vp and of the negative potential Vn become smaller. Then, the values of the positive potential Vp and of the negative potential Vn come gradually closer to their respective steady-state values with time constants that correspond to the current capacities of their respective charge pumps.

This case is based on an assumption, as an example, that the necessary specifications concerning the insertion loss and the distortions are satisfied when an on potential Von is 2.4 V or larger and an off potential Voff is −1 V or smaller.

According to the characteristics shown in FIG. 11, from the moment of the switching, it takes 8.5 μs for the negative potential Vn to reach a first potential of −1 V. So, a first period T1 is set to 8.5 μs. On the other hand, it takes 17.2 μs for the positive potential Vp to reach 2.4 V. Accordingly, the switching time is 17.2 μs.

A shorter switching time can be achieved by reducing the amount of change in the instantaneous positive potential Vp that occurs immediately after the switching. The reduction, however, needs a larger value of the capacitance of the output capacitor Cp, and the larger capacitance is used to refer to that the chip has a larger area.

Accordingly, if the semiconductor switch without the voltage controller 6*a* of the comparative example is to be formed into a radio-frequency antenna switch of a shorter switching time, the radio-frequency antenna switch has a problem of increased chip area.

Description will be given of the voltage controller 6*a* by referring back to FIG. 6.

As FIG. 6 shows, in the voltage controller 6*a*, the output of the negative voltage generator 7*a* is supplied to a differentiating circuit formed by a capacitor C1 and a resistor R1. The output of the differentiating circuit is connected to two-stage CMOS invertors INV1 and INV2. The output of the CMOS inverter INV2 is inputted into a resistance-load NMOS inverter. As the high-potential power supply of the resistance-load NMOS inverter, the positive potential Vp is supplied from the output line 9.

The output of the resistance-load NMOS inverter is connected to the gate of a PMOS P1 (first transistor). The source of the PMOS P1 (first transistor) is connected to the output line 9 of the positive voltage generator 7 whereas the drain of the PMOS P1 (first transistor) is connected to the power-supply line 8 of a supply potential Vdd.

The DC-bias potential of the differentiating circuit formed by the capacitor C1 and the resistor R1 is the potential Vref1 generated by the power-supply regulator 19, and is set to a value lower than the logical threshold voltage of the CMOS inverter INV1.

The potentials of the resistance-load NMOS inverter are similar to those described in the case of the voltage controller 6 shown in FIG. 2.

Next, description will be given as to the operation of the voltage controller 6a.

As shown in FIG. 11, when the switch section 2a switches the connection states from one to another, the negative potential Vn rises up instantaneously. Accordingly, the absolute value of the negative potential Vn becomes smaller.

The time constant for the capacitor C1 and the resistor R1 is set to a value that is sufficiently large with respect to the change in the negative potential Vn, which is the output of the negative voltage generator 7a. The differentiating circuit formed by the capacitor C1 and the resistor R1 cuts the DC component of the input and outputs only the AC component.

The differentiating circuit formed by the capacitor C1 and the resistor R1 detects the change of the negative potential Vn, and the potential V1 of the connection point of the capacitor C1 and the resistor R1 follows the change of the negative potential Vn. Specifically, the potential V1 rises up instantaneously from the bias potential Vref1 immediately after the switch section 2a switches the connection states from one to another. Then, the potential V1 comes gradually closer to the bias potential Vref1.

The logical threshold voltage of the CMOS inverter INV1 is set to a value that is higher than the bias potential Vref1. So, before the switching of the connection states by the switch section 2a, the CMOS inverter INV1 recognizes the potential V1 as being at the low level. Accordingly, the output of the CMOS inverter INV2 is at the low level. The resistance-load NMOS inverter outputs a high-level signal and thus the PMOS P1 (first transistor) is turned off. Consequently, the voltage controller 6a performs no operation at all.

Once the switch section 2a switches the connection states, the potential V1 exceeds the logical threshold of the CMOS inverter INV1. Thus, the CMOS inverter INV1 recognizes the potential V1 as being at the high level. Then, the PMOS P1 (first transistor) is turned on, and the output line 9 of the positive voltage generator 7 is connected to the power-supply line 8. Accordingly, the positive potential Vp never becomes lower than the supply potential Vdd.

As described above, the potential V1 rises up instantaneously from the bias potential Vref1, and then comes gradually closer to the bias potential Vref1. The potential V1 becomes lower than the logical threshold of the CMOS inverter INV1 after the first period T1 has passed from the switching of the connection states by switch section 2a. The CMOS inverter INV1 recognizes the potential V1 as being at the low level, and the output of the CMOS inverter INV2 becomes at the low level. The resistance-load NMOS inverter outputs a high-level signal and thus the PMOS P1 (first transistor) restores the off-state. Consequently, the voltage controller 6a restores the state of performing no operation at all.

As described above, the first period T1 is the period during which the negative potential Vn, or the output of the negative voltage generator 7a, stays higher than the first potential. In the voltage controller 6a shown in FIG. 6, the first period T1 is set based on the AC component of the output of the negative voltage generator 7a.

Figure 12:
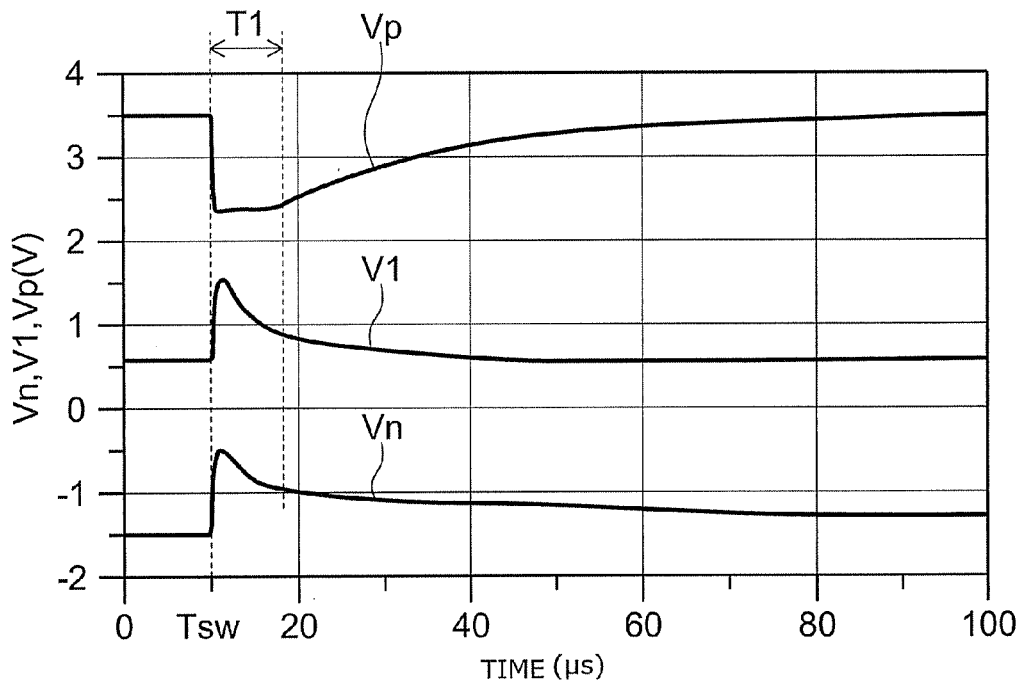
FIG. 12 is a timing chart of the major signals in the semiconductor switch shown in FIG. 6.

FIG. 12 is a timing chart of the major signals in the semiconductor switch 1a shown in FIG. 6.

FIG. 12 is a timing chart for the positive potential Vp, the potential V1, and the negative potential Vn when switching of the connection states occurs at the time Tsw=10 μs.

Note that the logical threshold voltage of the CMOS inverter INV1 is 0.9 V.

The potential V1 of the output of the differentiating circuit formed by the capacitor C1 and the resistor R1 instantaneously exceeds the 0.9 V logical threshold voltage of the CMOS inverter INV1. While the potential V1 stays above the logical threshold voltage, the PMOS P1 (first transistor) is in the on-state. Accordingly, the positive potential Vp is clamped approximately to the supply potential Vdd (specifically, to 2.4 V in this example).

Now, assume, for example, that the necessary specifications concerning the loss and the distortions are satisfied when an on potential Von is 2.4 V or larger and an off potential Voff is −1 V or smaller.

According to the characteristics shown in FIG. 12, from the moment of the switching, it takes 8.5 μs for the negative potential Vn to reach the first potential of −1 V. So, the first period T1 is set to 8.5 μs. In addition, the bias potential Vref1 is set to 0.6 V so that the potential V1 at the first period T1 can be equal to the 0.9 V logical threshold voltage. After the first period T1 has passed, the positive potential Vp stays at 2.4 V, so that the switching time is 8.5 μs, which is sufficiently short.

Note that the only difference between the example of FIG. 12 and the comparative example of FIG. 11 is the existence/non-existence of the voltage controller 6a. The other circuit constants are the same between the example of FIG. 12 and the comparative example of FIG. 11. In addition, the layout area needed for the voltage controller 6a is smaller enough to be ignored than the layout area for the output capacitor Cp.

As has been described thus far, according to the semiconductor switch 1a, the switching time can be improved without increasing the layout area.

Note that the semiconductor switch taken as an example in this embodiment is an SP6T one. Likewise, it is possible to employ a multiport switch, such as an SPnT one and an mPnT one (where m and n are natural numbers that are equal to or larger than 2).

Figure 13:
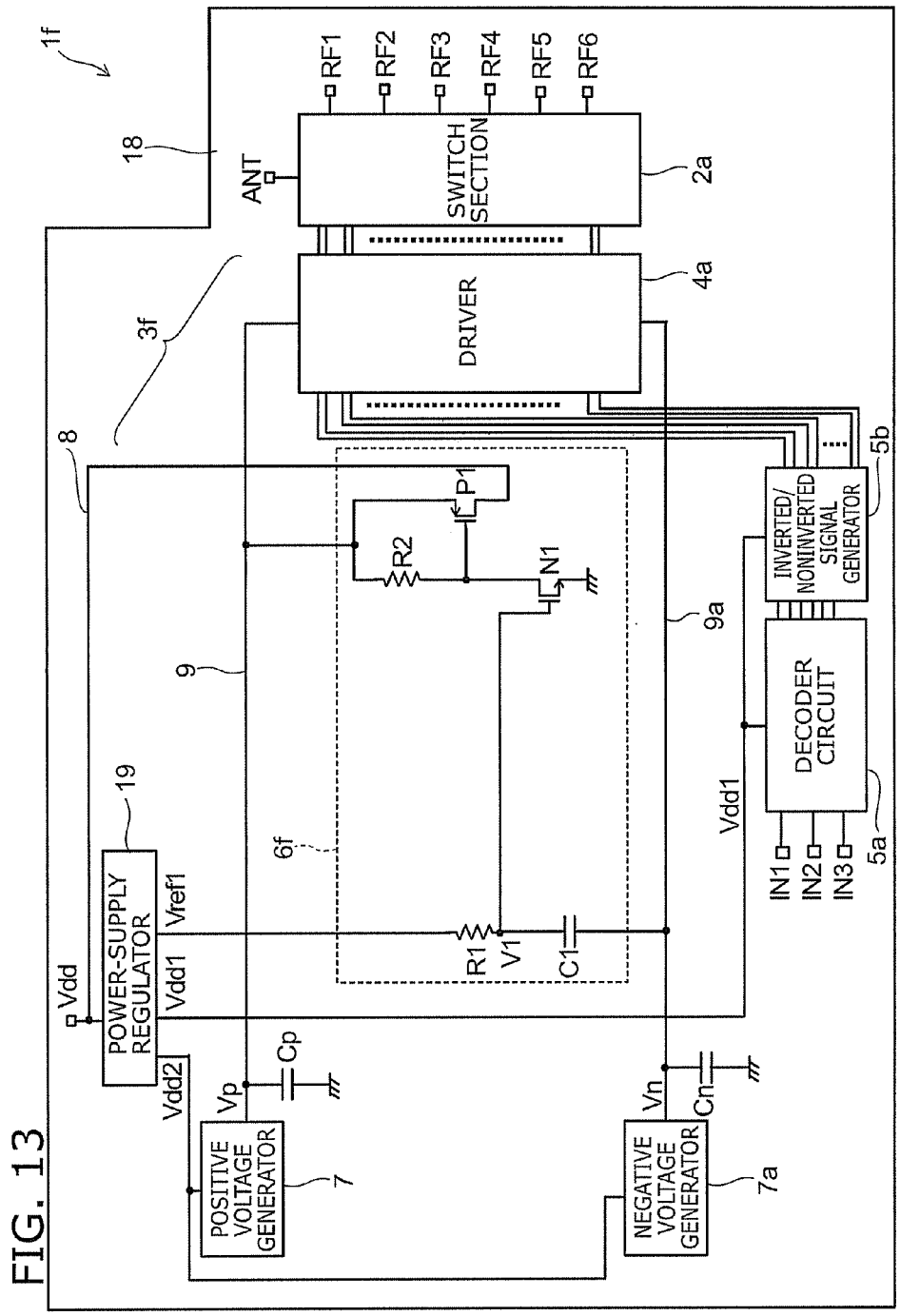
FIG. 13 is a circuit diagram illustrating the configuration of a semiconductor switch according to another embodiment of the invention.

FIG. 13 is a circuit diagram illustrating the configuration of a semiconductor switch according to another embodiment of the invention.

As shown in FIG. 13, a semiconductor switch 1f of this embodiment includes a switch section 2a, a driver 4a, a decoder circuit 5a, an inverted/noninverted signal generator 5b, a voltage controller 6f, a positive voltage generator 7, a negative voltage generator 7a, and a power-supply regulator 19. The semiconductor switch 1f has a structure in which all of these components are formed on a single substrate 18, and thereby the semiconductor switch 1f is formed as a single chip.

The semiconductor switch 1f substitutes the voltage controller 6f for the voltage controller 6a of the semiconductor switch is shown in FIG. 6. The switch section 2a, the driver 4a, the decoder circuit 5a, the inverted/noninverted signal generator 5b, the positive voltage generator 7, the negative voltage generator 7a, and the power-supply regulator 19 are identical to their respective counterparts shown in FIG. 6.

In the voltage controller 6f, the output of the negative voltage generator 7a is inputted into a differentiating circuit formed by a capacitor C1 and a resistor R1. The output of the differentiating circuit is inputted into a resistance-load NMOS inverter. The output of the resistance-load NMOS inverter is connected to the gate of a PMOS P1 (first transistor). The source of the PMOS P1 (first transistor) is connected to an output line 9 of the positive voltage generator 7 whereas the drain of the PMOS P1 (first transistor) is connected to a power-supply line 8 of a supply potential Vdd. Note that as the high-potential power supply of the resistance-load NMOS inverter, a positive potential Vp is supplied from the output line 9.

The CMOS inverters INV1 and INV2 of the voltage controller 6a shown in FIG. 6 are omitted from the configuration of the voltage controller 6f.

The DC-bias potential of the differentiating circuit formed by the capacitor C1 and the resistor R1 is a potential Vref1 generated by the power-supply regulator 19, and is set to a value lower than the logical threshold voltage of the resistance-load NMOS inverter.

The potential V1 of the connection point of the capacitor C1 and the resistor R1 follows the change of a negative potential Vn. Specifically, the potential V1 rises up instantaneously from the bias potential Vref1 immediately after the switch section 2a switches the connection states from one to another. Then, the potential V1 comes gradually closer to the bias potential Vref1.

The logical threshold voltage of the resistance-load NMOS inverter is set to a value that is higher than the bias potential Vref1. So, before the switching of the connection states by the switch section 2a, the resistance-load NMOS inverter recognizes the potential V1 as being at the low level. Accordingly, the resistance-load NMOS inverter outputs a high-level signal and thus the PMOS P1 (first transistor) is turned off. Consequently, the voltage controller 6a performs no operation at all.

When the switch section 2a switches the connection states, the potential V1 exceeds the logical threshold of the resistance-load NMOS inverter. Thus, the resistance-load NMOS inverter recognizes the potential V1 as being at the high level. Then, the PMOS P1 (first transistor) is turned on, and the output line 9 of the positive voltage generator 7 is connected to the power-supply line 8. Accordingly, the positive potential Vp never becomes lower than the supply potential Vdd.

As described above, the potential V1 rises up instantaneously from the bias potential Vref1, and then comes gradually closer to the bias potential Vref1. The potential V1 becomes lower than the logical threshold of the resistance-load NMOS inverter after the first period T1 has passed from the switching of the connection states by switch section 2a. The resistance-load NMOS inverter recognizes the potential V1 as being at the low level, and outputs a high-level signal. Thus, the PMOS P1 (first transistor) restores the off-state. Consequently, the voltage controller 6f restores the state of performing no operation at all.

As described above, the first period T1 is the period during which the negative potential Vn, or the output of the negative voltage generator 7a, stays higher than the first potential. In the voltage controller 6f shown in FIG. 13, the first period T1 is set based on the AC component of the output of the negative voltage generator 7a.

The bias potential Vref1 is set to a value so that the potential V1 becomes equal to the logical threshold of the resistance-load NMOS inverter when the negative potential Vn is the first potential.

As has been described thus far, according to the semiconductor switch 1f, the switching time can be improved without increasing the layout area.

Figure 14:
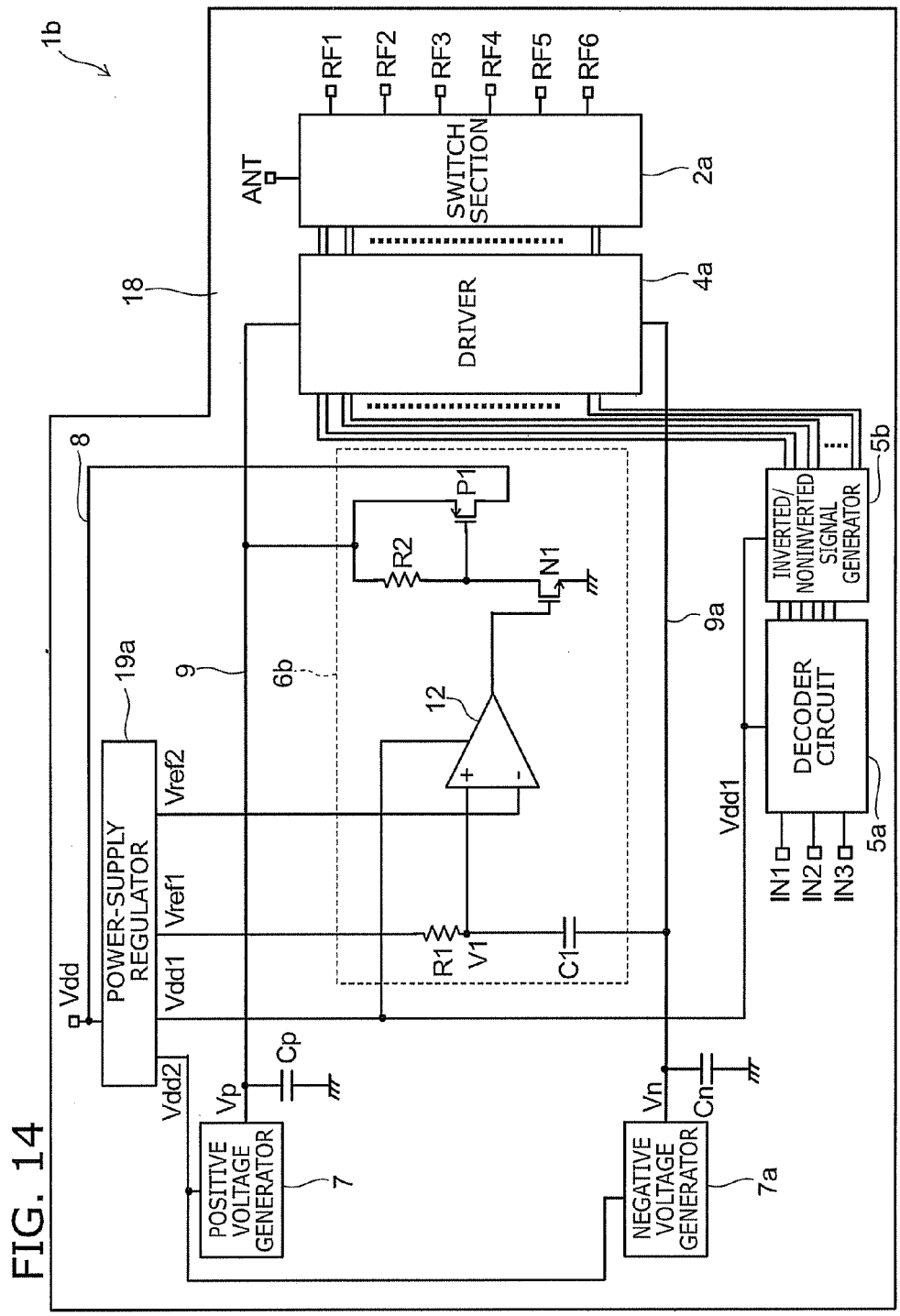
FIG. 14 is a circuit diagram illustrating the configuration of a semiconductor switch according to another embodiment of the invention.

FIG. 14 is a circuit diagram illustrating the configuration of a semiconductor switch according to another embodiment of the invention.

As shown in FIG. 14, a semiconductor switch 1b of this embodiment includes a switch section 2a, a driver 4a, a decoder circuit 5a, an inverted/noninverted signal generator 5b, a voltage controller 6b, a positive voltage generator 7, a negative voltage generator 7a, and a power-supply regulator 19a. The semiconductor switch 1b has a structure in which all of these components are formed on a single substrate 18, and thereby the semiconductor switch 1b is formed as a single chip.

The semiconductor switch 1b substitutes the voltage controller 6b and the power-supply regulator 19a respectively for the voltage controller 6a and the power-supply regulator 19 of the semiconductor switch 1a shown in FIG. 6. The switch section 2a, the driver 4a, the decoder circuit 5a, the inverted/noninverted signal generator 5b, the positive voltage generator 7, and the negative voltage generator 7a are identical to their respective counterparts shown in FIG. 6.

Like the semiconductor switch 1a, the semiconductor switch 1b is a multiport semiconductor switch that can be used for multimode/multiband radio apparatuses or the like.

The power-supply regulator 19a is designed to generate, from a supply potential Vdd, voltages Vdd1, Vdd2, Vref1, and Vref2 with respect to the ground.

The supply potential Vdd is, for example, within a range from 2.4 V to 3.2 V. The potential Vdd1 is, for example, 1.8 V. The output with the potential Vdd1 is supplied as the power source to the decoder circuit 5a and the inverted/noninverted signal generator 5b.

The potential Vdd2 is, for example, 2.4 V. The output with the potential Vdd2 is supplied as the power source to the positive voltage generator 7 and the negative voltage generator 7a. The potential Vref1 is a bias potential.

A positive potential Vp is supplied from the positive voltage generator 7 to the driver 4a whereas a negative potential Vn is supplied from the negative voltage generator 7a to the driver 4a.

The output line 9 of the positive voltage generator 7 is provided with an output capacitor Cp whereas the output line 9a of the negative voltage generator 7a is provided with an output capacitor Cn.

As FIG. 14 shows, in the voltage controller 6b, the output of the negative voltage generator 7a is supplied to a differentiating circuit formed by a capacitor C1 and a resistor R1. The output of the differentiating circuit is inputted into the non-inverting input terminal of a comparator 12. The inverting input terminal of the comparator 12 receives the supply of the reference potential Vref2 from the power-supply regulator 19a whereas the power-supply terminal of the comparator 12 receives the supply of the output with the potential Vdd1 from the power-supply regulator 19a.

The output of the comparator 12 is inputted into a resistance-load NMOS inverter. The output of the resistance-load NMOS inverter is inputted into the gate of a PMOS P1 (first transistor). The source of the PMOS P1 (first transistor) is connected to the output line 9 of the positive voltage generator 7 whereas the drain of the PMOS P1 (first transistor) is connected to a power-supply line 8 of a supply potential Vdd. Note that as the high-potential power supply of the resistance-load NMOS inverter, the positive potential Vp is supplied from the output line 9.

The DC-bias potential of the differentiating circuit formed by the capacitor C1 and the resistor R1 is the potential Vref1 generated by the power-supply regulator 19a, and the reference potential Vref2 is set to a value at the positive-potential side of the bias potential Vref1.

The time constant for the capacitor C1 and the resistor R1 is set to a value that is sufficiently large with respect to the change in the negative potential Vn, which is the output of the negative voltage generator 7a. The differentiating circuit formed by the capacitor C1 and the resistor R1 cuts the DC component of the input and outputs only the AC component.

The resistance-load NMOS inverter is similar to the one in the voltage controller 6a described by referring to FIG. 6.

Next, description will be given as to the operation of the voltage controller 6b.

As shown in FIG. 12, when the connection states are switched from one to another, the negative potential Vn rises up instantaneously. Accordingly, the absolute value of the negative potential Vn becomes smaller.

The differentiating circuit formed by the capacitor C1 and the resistor R1 detects the change of the negative potential Vn, and the potential V1 of the connection point of the capacitor C1 and the resistor R1 follows the change of the negative potential Vn. Specifically, the potential V1 rises up instantaneously from the bias potential Vref1 immediately after the switch section 2a switches the connection states from one to another. Then, the potential V1 comes gradually closer to the bias potential Vref1.

As described above, the reference potential Vref2 supplied to the inverting input terminal of the comparator 12 is set to a value that is higher than the bias potential Vref1. So, before the switching of the connection states by the switch section 2a, the potential V1 of the non-inverting input terminal of the comparator 12 is recognized as being at the low level. Accordingly, the output of the comparator 12 is at the low level. The resistance-load NMOS inverter outputs a high-level signal and thus the PMOS P1 (first transistor) is turned off. Consequently, the voltage controller 6b performs no operation at all.

When the switch section 2a switches the connection states, the potential V1 becomes higher than the reference potential Vref2. Thus the comparator 12 outputs a high-level signal. Then, the PMOS P1 (first transistor) is turned on, and the output line 9 of the positive voltage generator 7 is connected to the power-supply line 8. Accordingly, the positive potential Vp never becomes lower than the supply potential Vdd.

The timing chart for the positive potential Vp, the potential V1, and the negative potential Vn of a case where the switching occurs is similar to the one shown in FIG. 12.

As has been described thus far, according to the semiconductor switch 1b, the switching time can be improved without increasing the layout area.

Note that the semiconductor switch taken as an example in this embodiment is an SP6T one. Likewise, it is possible to employ a multiport switch, such as an SPnT one and an mPnT one (where m and n are natural numbers that are equal to or larger than 2).

Figure 15:
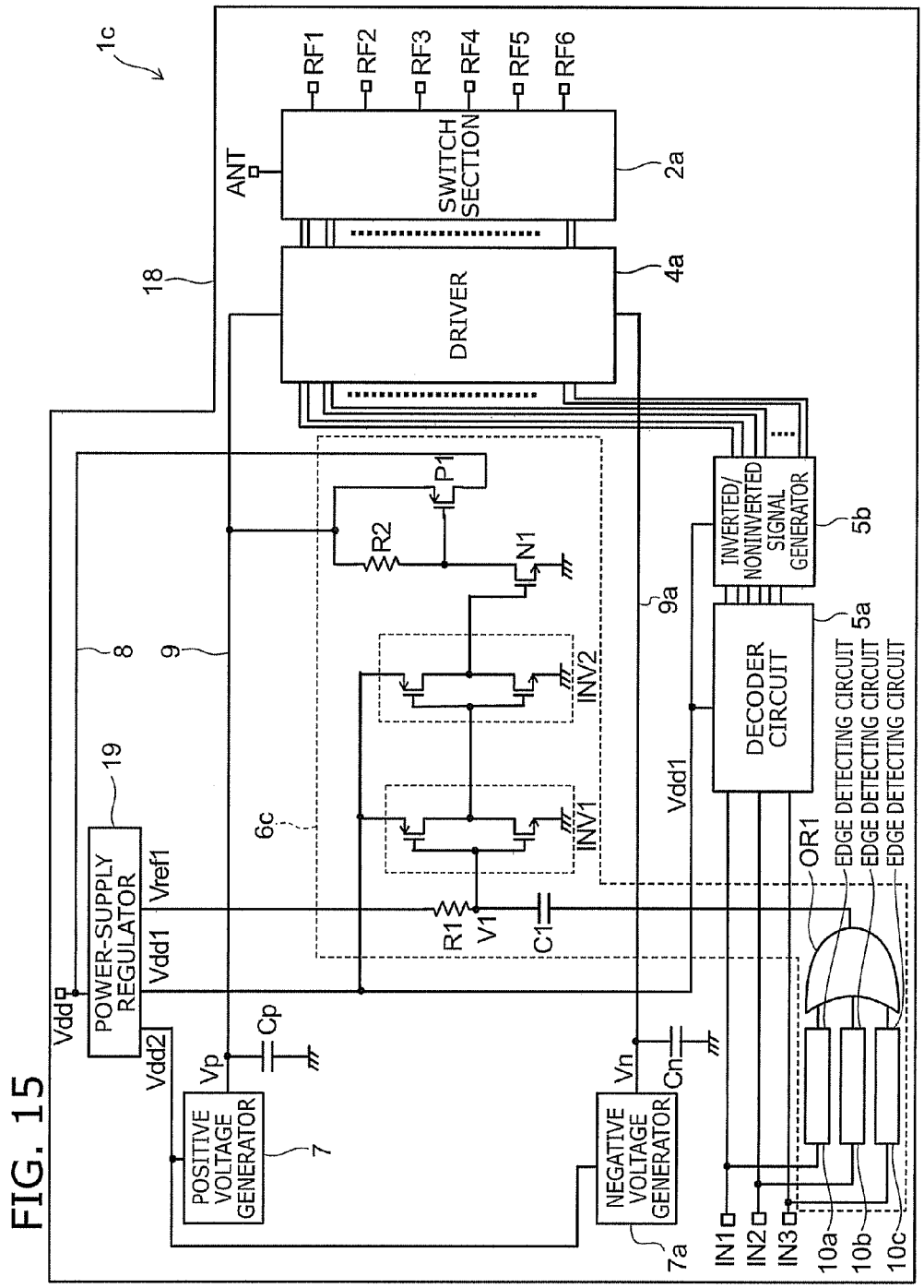
FIG. 15 is a circuit diagram illustrating the configuration of a semiconductor switch according to another embodiment of the invention.

FIG. 15 is a circuit diagram illustrating the configuration of a semiconductor switch according to another embodiment of the invention.

As FIG. 15 shows, a semiconductor switch is of this embodiment includes a switch section 2a, a driver 4a, a decoder circuit 5a, an inverted/noninverted signal generator 5b, a voltage controller 6c, a positive voltage generator 7, a negative voltage generator 7a, and a power-supply regulator 19. The semiconductor switch is has a structure in which all of these components are formed on a single substrate 18, and thereby the semiconductor switch is formed as a single chip.

The semiconductor switch is substitutes the voltage controller 6c for the voltage controller 6a of the semiconductor switch 1a shown in FIG. 6. The switch section 2a, the driver 4a, the decoder circuit 5a, the inverted/noninverted signal generator 5b, the positive voltage generator 7, the negative voltage generator 7a, and the power-supply regulator 19 are identical to their respective counterparts shown in FIG. 6.

Like the semiconductor switch 1a, the semiconductor switch 1c is an SP6T semiconductor switch that can be used for multimode/multiband radio apparatuses or the like.

As FIG. 15 shows, the voltage controller 6c has a configuration based on the voltage controller 6a shown in FIG. 6, but additionally includes a circuit to detect the switching among terminal switching signals IN1 to IN3. Specifically, this additional circuit includes edge detecting circuits 10a to 10c and an OR circuit OR1.

The terminal switching signals IN1 to IN3 are inputted respectively into the edge detecting circuits 10a to 10c. The outputs of the edge detecting circuits 10a to 10c are inputted into the OR circuit OR1. The output of the OR circuit OR1 is inputted into a differentiating circuit formed by a capacitor C1 and a resistor R1.

Each of the edge detecting circuits 10a to 10c is identical to the edge detecting circuit 10 of the voltage controller 6 shown in FIG. 2. Only when the terminal switching signals IN1 to IN3 change, the edge detecting circuits 10a to 10c generates pulses with a width of a first period T1. Specifically, as FIGS. 4A to 4C show, at the time of the leading edge and at the time of the trailing edge, that is, when changes occur in the terminal switching signals IN1 to IN3, pulses with a width of a first period T1 are generated. For example, each of the edge detecting circuits 10a to 10c may have a configuration illustrated by the circuit diagram shown in FIG. 3. The width of each pulse is defined by the time constant for the RC delay circuit DLY shown in FIG. 3.

Note that each of the edge detecting circuits 10a to 10c may have such a configuration as one shown in FIG. 2, that is, a configuration including an edge detecting circuit 10 and a pulse generator 11 that are connected in series to each other.

A pulse with a width of the first period T1 is generated in the output of the OR circuit OR1 when at least one of the terminal switching signals IN1 to IN3 changes. Accordingly, the edge detecting circuits 10a to 10c and the OR circuit OR1 together form a circuit to detect the switching among the terminal switching signals IN1 to IN3.

As described above, the output of the OR circuit OR1 is supplied to the differentiating circuit formed by the capacitor C1 and the resistor R1. The output of the differentiating circuit is inputted into two-stage CMOS inverters INV1 and INV2.

The output of the CMOS inverter INV2 is inputted into a resistance-load NMOS inverter. As a high-potential power supply for the resistance-load NMOS inverter, a positive potential Vp is supplied from an output line 9. The output of the resistance-load NMOS inverter is inputted into the gate of a PMOS P1 (first transistor). The source of the PMOS P1 (first transistor) is connected to the output line 9 of the positive voltage generator 7 whereas the drain of the PMOS P1 (first transistor) is connected to the power-supply line 8 of a supply potential Vdd.

The DC-bias potential of the differentiating circuit formed by the capacitor C1 and the resistor R1 is the potential Vref1 generated by the power-supply regulator 19, and is set to a value lower than the logical threshold voltage of the CMOS inverter INV1.

The differentiating circuit formed by the capacitor C1 and the resistor R1 cuts the DC component of the input and outputs only the AC component.

The differentiating circuit, the CMOS inverters INV1 and INV2, and the resistance-load NMOS inverter are similar to those in the voltage controller 6a described by referring to FIG. 6.

In the voltage controller 6c, the first period T1 is thus set based on the AC components of the terminal switching signals IN1 to IN3.

Next, description will be given as to the operation of the voltage controller 6c.

When the connection states are switched from one to another, a pulse with a width of the first period T1 is generated in the output of the OR circuit OR1. The differentiating circuit formed by the capacitor C1 and the resistor R1 detects the pulse, and the potential V1 of the connection point of the capacitor C1 and the resistor R1 follows the change of the output of the OR circuit OR1.

The logical threshold of the CMOS inverter INV1 is set to a value that is higher than a bias potential Vref1. So, before the switching of the connection states by the switch section 2a, the CMOS inverter INV1 recognizes the potential V1 as being at the low level. Accordingly, the output of the CMOS inverter INV2 is at the low level. The resistance-load NMOS inverter outputs a high-level signal and thus the PMOS P1 (first transistor) is turned off. Consequently, the voltage controller 6c performs no operation at all.

Once any one of the terminal switching signals IN1 to IN3 changes and the switching of the connection states occurs, a pulse is generated in the OR circuit OR1. While the pulse is at the high level, the PMOS P1 (first transistor) is in the on-state, and the output line 9 of the positive voltage generator 7 is connected to the power-supply line 8. Accordingly, the positive potential Vp never becomes lower than the supply potential Vdd.

As has been described thus far, according to the semiconductor switch 1c, the switching time can be improved without increasing the layout area.

Note that the first period T1 during which the PMOS P1 (first transistor) is in the on-state is set by the edge detecting circuits 10a to 10c. It is, however, possible to adjust the first period T1 by the bias potential Vref1 and by the time constant for the capacitor C1 and the resistor R1.

In addition, as in the case of the voltage controller 6f shown in FIG. 13, the CMOS inverters INV1 and INV2 may be omitted from the configuration of the voltage controller 6c.

In addition, the semiconductor switch taken as an example in this embodiment is an SP6T one. Likewise, it is possible to employ a multiport switch, such as an SPnT one and an mPnT one (where m and n are natural numbers that are equal to or larger than 2).

In addition, the example configuration of this embodiment includes the negative voltage generator 7a, but the negative voltage generator 7a may be omitted if the switch section 2a and the driver 4a have some particular configurations.

Figure 16:
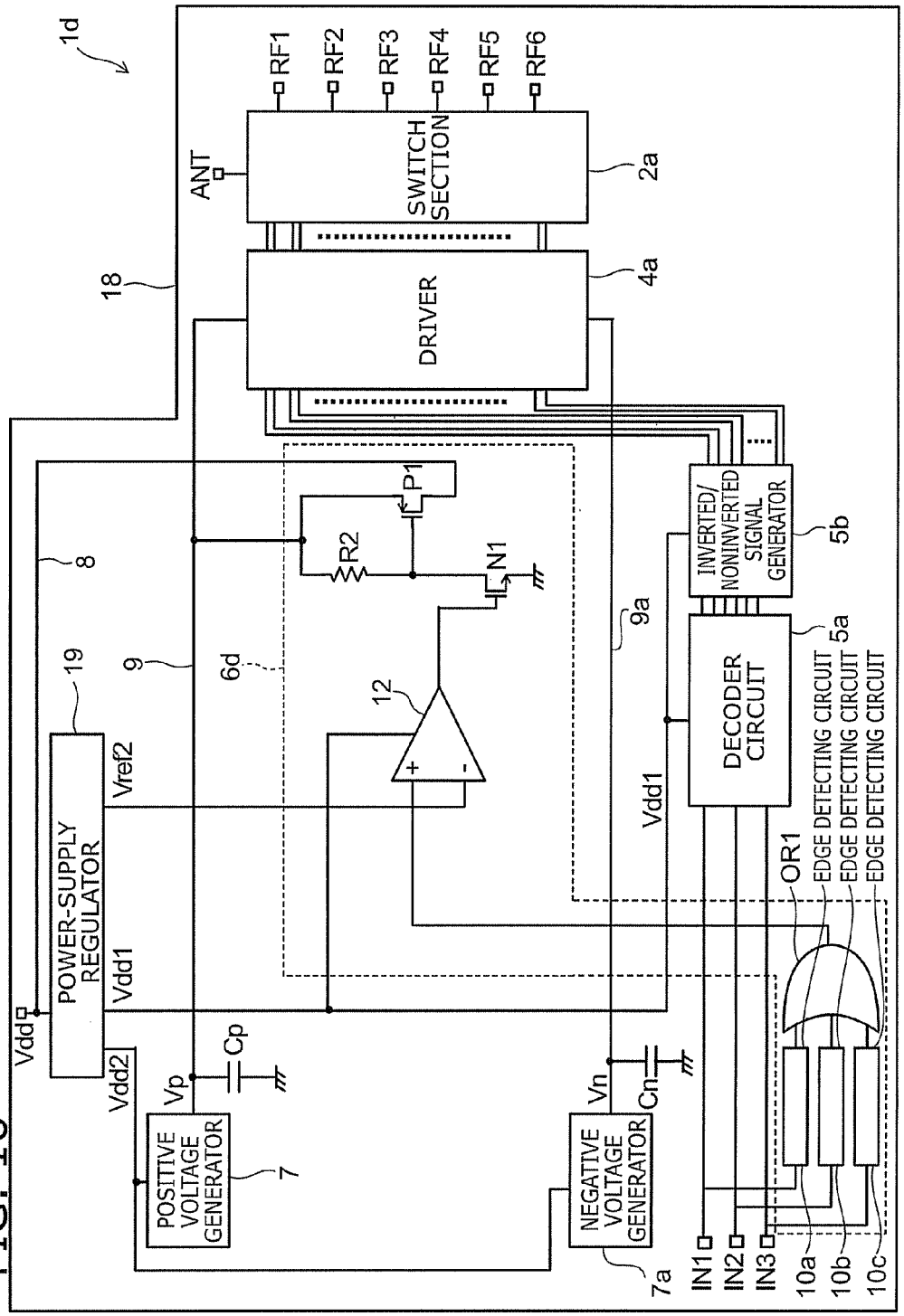
FIG. 16 is a circuit diagram illustrating the configuration of a semiconductor switch according to another embodiment of the invention.

FIG. 16 is a circuit diagram illustrating the configuration of a semiconductor switch according to another embodiment of the invention.

As FIG. 16 shows, a semiconductor switch 1d of this embodiment includes a switch section 2a, a driver 4a, a decoder circuit 5a, an inverted/noninverted signal generator 5b, a voltage controller 6d, a positive voltage generator 7, a negative voltage generator 7a, and a power-supply regulator 19. The semiconductor switch 1d has a structure in which all of these components are formed on a single substrate 18, and thereby the semiconductor switch 1d is formed as a single chip.

The semiconductor switch 1d substitutes the voltage controller 6d for the voltage controller 6c of the semiconductor switch 1c shown in FIG. 15. The switch section 2a, the driver 4a, the decoder circuit 5a, the inverted/noninverted signal generator 5b, the positive voltage generator 7, the negative voltage generator 7a, and the power-supply regulator 19 are identical to their respective counterparts shown in FIG. 15.

Like the semiconductor switch 1c, the semiconductor switch 1d is an SP6T semiconductor switch that can be used for multimode/multiband radio apparatuses or the like.

The power-supply regulator 19 is designed to generate, from a supply potential Vdd, voltages Vdd1, Vdd2, and Vref2 with respect to the ground.

The potential Vdd, Vdd1, Vdd2 are the same as those generated in the case of the power-supply regulator 19 shown in FIG. 6. Specifically, the supply potential Vdd supplied from outside is, for example, within a range from 2.4 V to 3.2 V.

The potential Vdd1 is, for example, 1.8 V. The output with the potential Vdd1 is supplied as the power source to the decoder circuit 5a and the inverted/noninverted signal generator 5b. The potential Vdd2 is, for example, 2.4 V. The output with the potential Vdd2 is supplied as the power source to the positive voltage generator 7 and the negative voltage generator 7a. The reference potential Vref2 is set to a value approximately in the middle between the high level output and the low level output of the OR circuit OR1, which are the outputs of a circuit to detect the switching among the terminal switching signals IN1 to IN3.

As FIG. 16 shows, the voltage controller 6d substitutes a comparator 12 for the two-stage CMOS inverters INV1 and INV2 and the differentiating circuit formed by the capacitor C1 and the resistor R1 of the voltage controller 6c shown in FIG. 15.

As described by referring to FIG. 15, edge detecting circuits 10a to 10c and the OR circuit OR1 together form a circuit to detect the switching among the terminal switching signals IN1 to IN3. The circuit to detect the switching among the terminal switching signals IN1 to IN3 generates a pulse with a width of the first period T1 when at least one of the inputted terminal switching signals IN1 to IN3 changes.

The output of the OR circuit OR1 is inputted into a non-inverting input terminal of a comparator 12. The inverting input terminal of the comparator 12 receives the supply of the reference potential Vref2 from the power-supply regulator 19 whereas the power-supply terminal of the comparator 12 receives the potential Vdd1 from the power-supply regulator 19.

The output of the comparator 12 is inputted into a resistance-load NMOS inverter. The output of the resistance-load NMOS inverter is inputted into the gate of a PMOS P1 (first transistor). The source of the PMOS P1 (first transistor) is connected to an output line 9 of the positive voltage generator 7, whereas the drain of the PMOS P1 (first transistor) is connected to a power-supply line 8 and receives the supply of the supply potential Vdd. Note that as the high-potential power supply of the resistance-load NMOS inverter, a positive potential Vp is supplied from the output line 9.

In addition, the comparator 12 and the resistance-load NMOS inverter are similar to their respective counterparts in the voltage controller 6b described by referring to FIG. 14.

Next, description will be given as to the operation of the voltage controller 6d.

As described above, the reference potential Vref2 supplied to the inverting input terminal of the comparator 12 is set to a value approximately in the middle between the high level output and the low level output of the OR circuit OR1, which are the outputs of the circuit to detect the switching among the terminal switching signals IN1 to IN3. So, before the switching of the connection states, the potential V1 of the non-inverting input terminal of the comparator 12 is recognized as being at the low level. Accordingly, the output of the comparator 12 is at the low level. The resistance-load NMOS inverter outputs a high-level signal and thus the PMOS P1 (first transistor) is turned off. Consequently, the voltage controller 6d performs no operation at all.

Once the switching of the connection states occurs, a pulse with a width of a first period T1 is generated in the output of the OR circuit OR1. The potential of the non-inverting input terminal of the comparator 12 becomes higher than the reference potential Vref2. Thus the comparator 12 outputs a high-level signal. Then, the PMOS P1 (first transistor) is turned on, and the output line 9 of the positive voltage generator 7 is connected to the power-supply line 8. Accordingly, the positive potential Vp never becomes lower than the supply potential Vdd.

As has been described thus far, according to the semiconductor switch 1d, the switching time can be improved without increasing the layout area.

Note that the semiconductor switch taken as an example in this embodiment is an SP6T one. Likewise, it is possible to employ a multiport switch, such as an SPnT one and an mPnT one (where m and n are natural numbers that are equal to or larger than 2).

In addition, the example configuration of this embodiment includes the negative voltage generator 7a, but the negative voltage generator 7a may be omitted if the switch section 2a and the driver 4a have some particular configurations.

Figure 17:
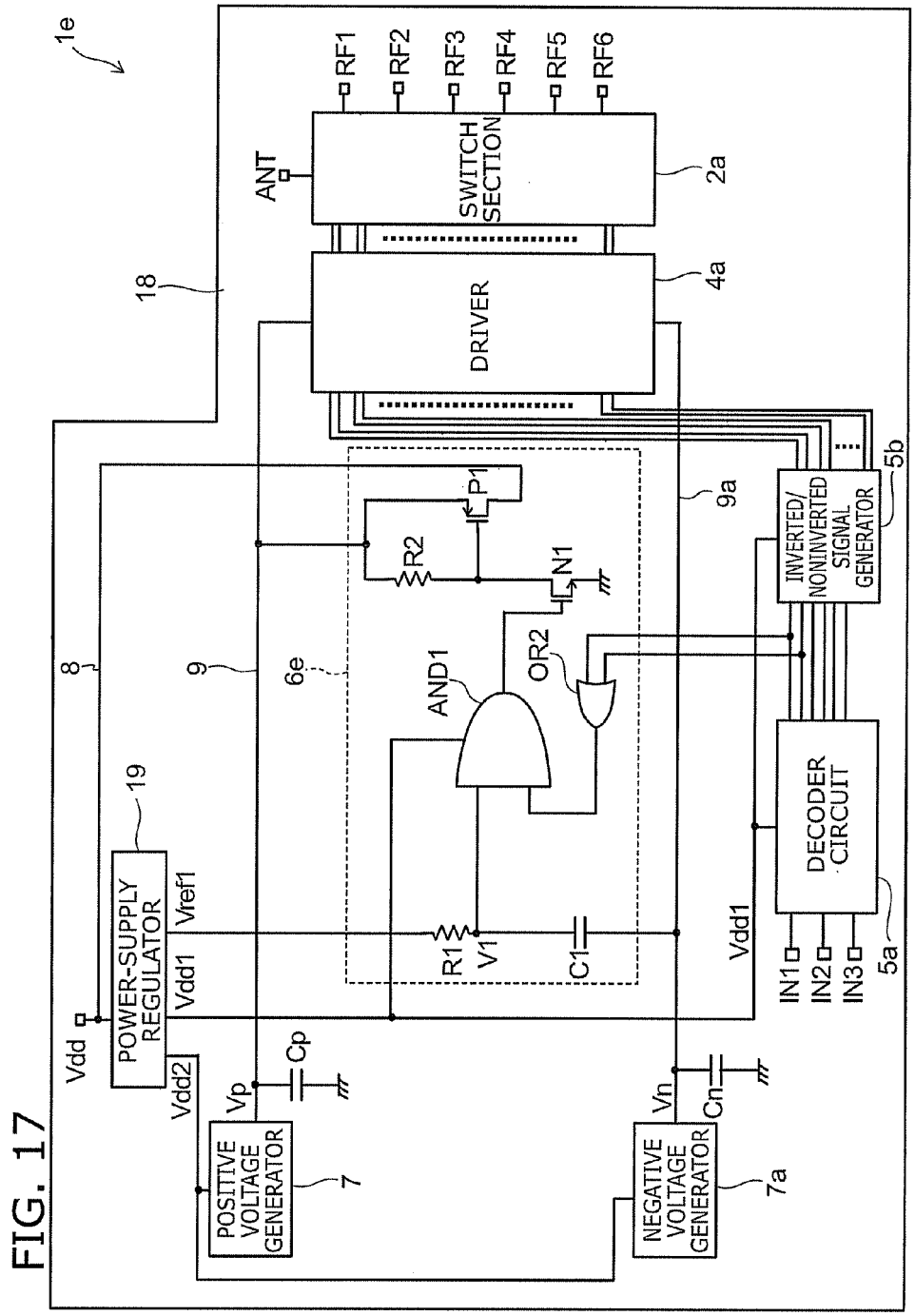
FIG. 17 is a circuit diagram illustrating the configuration of a semiconductor switch according to another embodiment of the invention.

FIG. 17 is a circuit diagram illustrating the configuration of a semiconductor switch according to another embodiment of the invention.

As FIG. 17 shows, a semiconductor switch 1e of this embodiment includes a switch section 2a, a driver 4a, a decoder circuit 5a, an inverted/noninverted signal generator 5b, a voltage controller 6e, a positive voltage generator 7, a negative voltage generator 7a, and a power-supply regulator 19. The semiconductor switch 1e has a structure in which all of these components are formed on a single substrate 18, and thereby the semiconductor switch 1e is formed as a single chip.

The semiconductor switch 1e substitutes the voltage controller 6e for the voltage controller 6a of the semiconductor switch 1a shown in FIG. 6. The switch section 2a, the driver 4a, the decoder circuit 5a, the inverted/noninverted signal generator 5b, the positive voltage generator 7, the negative voltage generator 7a, and the power-supply regulator 19 are identical to their respective counterparts shown in FIG. 6.

Like the semiconductor switch 1a, the semiconductor switch 1e is a multiport semiconductor switch that can be used for multimode/multiband radio apparatuses or the like.

As FIG. 17 shows, in the voltage controller 6e, the output of the negative voltage generator 7a is supplied to a differentiating circuit formed by a resistor R1 and a capacitor C1. The output of the differentiating circuit is inputted into one of the two input terminals of a two-input AND circuit AND1.

The AND circuit AND1 receives the power supply of a potential Vdd1 from the power-supply regulator 19 whereas an OR circuit OR2 receives the power supply (not illustrated) of the potential Vdd1 from the power-supply regulator 19.

The output of the AND circuit AND1 is inputted into a resistance-load NMOS inverter. The output of the resistance-load NMOS inverter is inputted into the gate of a PMOS P1 (first transistor). The source of the PMOS P1 (first transistor) is connected to an output line 9 of the positive voltage generator 7, whereas the drain of the PMOS P1 (first transistor) is connected to a power-supply line 8 with a supply potential Vdd. Note that as the high-potential power supply of the resistance-load NMOS inverter, a positive potential Vp is supplied from the output line 9.

The DC-bias potential of the differentiating circuit formed by the capacitor C1 and the resistor R1 is a potential Vref1 generated by the power-supply regulator 19, and is set to a value lower than the logical threshold voltage of the AND circuit AND1.

The time constant for the capacitor C1 and the resistor R1 is set to a value that is sufficiently large with respect to the change in the negative potential Vn, which is the output of the negative voltage generator 7a. The differentiating circuit formed by the capacitor C1 and the resistor R1 cuts the DC component of the input and outputs only the AC component.

The resistance-load NMOS inverter is similar to the one described in the case of the voltage controller 6a shown in FIG. 6.

The input into the other one of the two input terminals of the AND circuit AND1 is given by a circuit that is characteristic of this embodiment.

Through-FETs are included in the switch section 2a in the embodiment. Now, suppose that the total gate width of the through-FETs in one port differs from that of the through-FETs in another port. If the total gate width of the through-FETs in a particular RF port is sufficiently small, the positive potential Vp hardly falls down at the switching operation to achieve the conduction of the RF port.

In this case, it is not necessary to make the voltage controller 6e function. Conversely, if the voltage controller 6e is made to function, the positive potential Vp unnecessarily falls down to the supply potential Vdd.

To avoid such unnecessary fall of the positive potential Vp, the voltage controller 6e of this embodiment is made to function only in the case where the through-FETs of a large total gate width are turned on. Specifically, a logical sum signal including only the necessary ones of the outputs of the decoder circuit 5a is generated by the OR circuit OR2. The logical sum signal thus generated is used as the input into the other input terminal of the AND circuit AND1.

Next, description will be given as to the operation of the voltage controller 6e.

As FIG. 12 shows, when the switch section 2a switches the connection states from one to another, the negative potential Vn rises up instantaneously. Accordingly, the absolute value of the negative potential Vn becomes smaller.

The differentiating circuit formed by the capacitor C1 and the resistor R1 detects the change of the negative potential Vn, and the potential V1 of the connection point of the capacitor C1 and the resistor R1 follows the change of the negative potential Vn. Specifically, the potential V1 rises up instantaneously from the bias potential Vref1 immediately after the switch section 2a switches the connection states from one to another. Then, the potential V1 comes gradually closer to the bias potential Vref1.

As described above, upon the occurrence of the switching that requires the voltage controller 6e to operate, a high-level pulse is outputted also from the OR circuit OR2. Conversely, if the switching that occurs does not require the voltage controller 6e to operate, the output of the OR circuit OR2 remains at the low level.

Accordingly, both of the two inputs into the AND circuit AND1 simultaneously become at the high level only upon the occurrence of the switching that requires the voltage controller 6e to operate. Then, the PMOS P1 (first transistor) is turned on, and the output line 9 of the positive voltage generator 7 is connected to the power-supply line 8. Accordingly, the positive potential Vp never becomes lower than the supply potential Vdd.

As has been described thus far, according to the semiconductor switch 1e, the switching time can be improved without increasing the layout area.

In addition, the semiconductor switch 1e of this embodiment performs a control that turns the PMOS P1 (first transistor) on when the switch section 2a switches the connection states to a state where the positive potential Vp, which is the output of the positive voltage generator 7, becomes lower than the supply potential Vdd of the power-supply line 8.

Accordingly, the positive potential Vp never falls down to the supply potential Vdd unnecessarily.

Note that the semiconductor switch taken as an example in this embodiment is an SP6T one. Likewise, it is possible to employ a multiport switch, such as an SPnT one and an mPnT one (where m and n are natural numbers that are equal to or larger than 2).

The embodiments of the invention have been described thus far by referring to examples. These examples, however, are not the only possible ways of carrying out the invention. For example, those skilled in the art can similarly carry out the invention and can achieve similar advantageous effects by selecting appropriately the specific configuration of the elements included in the semiconductor switch of the invention from those configurations that have already been known publicly. The scope of the invention includes such cases.

In addition, two or more elements included in different ones of the specific examples described above may be combined together as long as such combinations are technically possible. Such combinations are also within the scope of the invention as long as the combinations still include the gist of the invention.

In addition, those skilled in the art may make appropriate modifications in design to the semiconductor switches of the above-described embodiments of the invention. All the semiconductor switches obtained by such modifications also stay within the scope of the invention as long as the modified semiconductor switches still include the gist of the invention.

In addition, those skilled in the art may conceive of various modifications and changes without departing the basic idea of the invention. The examples including such modifications and changes should be understood as being within the scope of the invention.

What is claimed is:

1. A semiconductor switch comprising:
a power-supply regulator generating voltages;
a switch section, provided on a substrate, switching connection states among a plurality of terminals;
a positive voltage generator generating a positive potential higher than a supply potential supplied by the power-supply regulator, the positive voltage generator having an output capacitor;
a negative voltage generator generating a negative potential from the supply potential supplied by the power-supply regulator, the negative voltage generator having an output capacitor, a capacitance of the output capacitor of the negative voltage generator being smaller than a capacitance of the output capacitor of the positive voltage generator;
a driver, connected to the positive voltage generator and the negative voltage generator, supplying a control signal to the switch section in response to a terminal switching signal, a high level of the control signal being equal to the positive potential, a low level of the control signal being equal to the negative potential; and
a voltage controller controlling the positive potential supplied to the driver.

2. The switch according to claim 1, wherein
the switch section includes a plurality of FETs driven by the control signal,
a total gate capacitance of off-state FETs in the plurality of FETs is configured to contribute to the capacitance of the output capacitor of the negative voltage generator.

3. The switch according to claim 1, wherein
the switch section includes a plurality of FETs driven by the control signal,
off-state FETs in the plurality of FETs are more than on-state FETs in the plurality of FETs.

* * * * *